(12) United States Patent
Kobayashi

(10) Patent No.: US 8,361,865 B2
(45) Date of Patent: Jan. 29, 2013

(54) METHOD OF MANUFACTURING A SEMICONDUCTOR DEVICE HAVING VERTICAL MOSFET

(75) Inventor: Kenya Kobayashi, Kanagawa (JP)

(73) Assignee: Renesas Electronics Corporation, Kawasaki-shi, Kanagawa ( * ) Notice: Subject to any disclaimer, the term of this patent is extended or adjusted under 35 U.S.C. 154(b) by 44 days.

(21) Appl. No.: 12/926,678

(22) Filed: Dec. 3, 2010

(65) Prior Publication Data
US 2011/0081756 A1 Apr. 7, 2011

Related U.S. Application Data

(62) Division of application No. 12/081,931, filed on Apr. 23, 2008, now Pat. No. 7,893,489.

(30) Foreign Application Priority Data

Apr. 26, 2007 (JP) .................................. 2007-116351

(51) Int. Cl.
*H01L 21/336* (2006.01)
(52) U.S. Cl. ................ 438/270; 438/700; 257/E29.257; 257/E21.419
(58) Field of Classification Search .................. 438/270, 438/700; 257/E21.419, E29.257
See application file for complete search history.

(56) References Cited

U.S. PATENT DOCUMENTS

| 5,283,454 A * | 2/1994 | Cambou ......................... 257/328 |
| 6,600,194 B2 * | 7/2003 | Hueting et al. ................ 257/331 |
| 6,653,740 B2 | 11/2003 | Kinzer et al. |
| 2001/0020720 A1 | 9/2001 | Hueting et al. |
| 2007/0032029 A1 * | 2/2007 | Chow et al. .................... 438/330 |

FOREIGN PATENT DOCUMENTS

| JP | 2000-315792 A | 11/2000 |
| JP | 2003-526948 A | 9/2003 |

OTHER PUBLICATIONS

Notification of Reasons(s) for Refusal with English translation dated Aug. 21, 2012.

* cited by examiner

*Primary Examiner* — Jerome Jackson, Jr.
*Assistant Examiner* — Paul Budd
(74) *Attorney, Agent, or Firm* — McGinn IP Law Group, PLLC

(57) ABSTRACT

A method of manufacturing a semiconductor device, includes forming a first trench and a second trench in a semiconductor region of a first conductivity type simultaneously, forming a gate insulating film and a gate electrode in the first trench, forming a channel region of a second conductivity type in the semiconductor region, forming a source region of the first conductivity type in the channel region, forming a diffusion region of the first conductivity type which has a higher concentration than that of the semiconductor region in a part of the semiconductor region located immediately under the second trench by implanting impurity ions of the first conductivity type through the second trench, and forming a drain electrode in a part of the second trench.

16 Claims, 32 Drawing Sheets

200

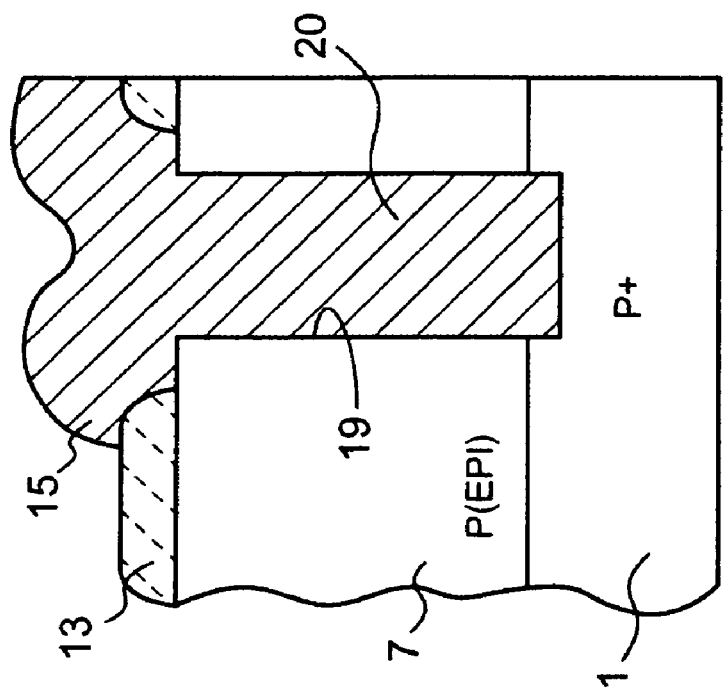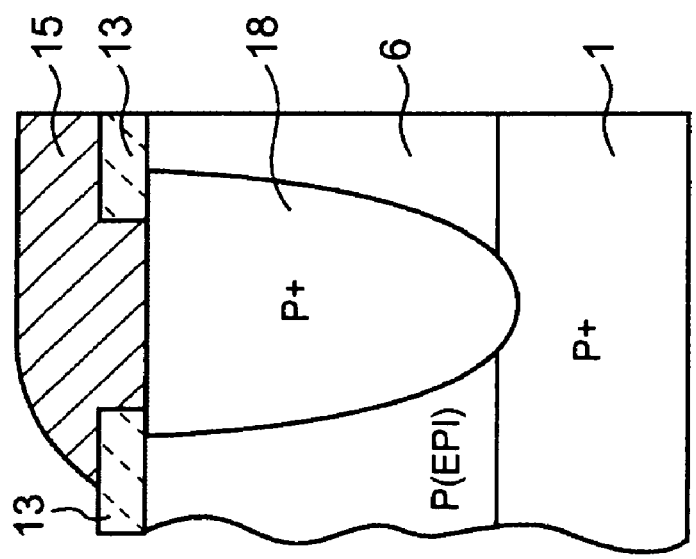

METHOD OF MANUFACTURING A SEMICONDUCTOR DEVICE HAVING VERTICAL MOSFET

The present Application is a Divisional Application of U.S. patent application Ser. No. 12/081,931, filed on Apr. 23, 2008 now U.S. Pat. No. 7,893,489.

CROSS-REFERENCE TO RELATED APPLICATIONS

This application is based upon, claims the benefit of priority of, and incorporates by reference the contents of Japanese Patent Application No. 2007-116351 filed on Apr. 26, 2007.

BACKGROUND

1. Field of the Invention

The present invention relates to a semiconductor device having a vertical metal-oxide-semiconductor field-effect transistor (MOSFET) and a method of manufacturing the semiconductor device.

2. Description of Related Art

A vertical MOSFET is normally used as a power device such as a power MOSFET serving as a power switch for large current and high voltage. In the vertical MOSFET, a source electrode and a gate electrode are formed on a principal surface of a semiconductor chip and a drain electrode is formed on a rear surface thereof. A drain current flows in a longitudinal direction of the semiconductor chip (from the principal surface to the rear surface). In order to suppress power consumption, the power MOSFET requires a minimum ON-resistance. Therefore, there has been developed a vertical MOSFET in which the gate electrode is formed in a trench and a channel region is formed in a longitudinal direction to narrow an interval between gate electrodes, thereby realizing a high density to reduce an ON-resistance per unit area.

In recent years, there has been appeared a chip size package (CSP) in which the source electrode, the gate electrode, and the drain electrode of the vertical MOSFET are formed on a single surface of a semiconductor die. According to a conventional vertical MOSFET disclosed in U.S. Pat. No. 6,653,740 B2, in order to electrically connect a drain region formed in a rear surface of the semiconductor die with the drain electrode formed on the principal surface of the semiconductor die, a high-concentration diffusion region or a buried conductive layer is used.

The conventional vertical MOSFET disclosed in U.S. Pat. No. 6,653,740 B2 will be described with reference to the attached drawings. FIG. 30 is a perspective view showing a semiconductor die 10. FIG. 31 is a cross sectional view showing the semiconductor die 10. FIGS. 32A and 32B are cross sectional views showing other examples of a drain connection portion of the semiconductor die 10.

As shown in FIG. 30, an external source terminal 2, an external drain terminal 3, and an external gate terminal 4 are formed on a principal surface of a silicon body 1. As shown in FIG. 31, gate electrodes 11 are buried in gate trenches 16 and electrically connected with the external gate terminal 4 through a gate wiring 5 shown in FIG. 30.

As shown in FIG. 31, a drift region 6 which is a P-type epitaxial layer is formed in a surface of the $P^+$-type silicon body 1 which is a drain region. An N-type channel region 7 is formed in the drift region 6. $P^+$-type source regions 8 are formed in a surface of the channel region 7. The gate trenches 16 are formed so as to extend through the source regions 8 and the channel region 7 and reach the drift region 6. The gate electrodes 11 are buried in the gate trenches 16 through gate insulating films 12. The gate electrodes 11 are electrically connected with each other and electrically connected with the gate wiring 5 (not shown). Interlayer insulating films 13 are formed on the gate electrodes 11. A source electrode 14 is formed to cover the interlayer insulating films 13. The source electrode 14 has contact holes 17, each of which is formed so as to extend through a part of the source region 8. The source electrode 14 is electrically connected with the source regions 8 through the contact holes 17 and electrically connected with the channel region 7 through $N^+$-type contact diffusion regions 9 formed in bottom surfaces of the contact holes 17. The source electrode 14 is electrically connected with the external source terminal 2 (not shown).

The channel region through which a drain current flows is formed in a longitudinal direction along a side surface of the gate trenches 16. The drain current flows from each of the source regions 8 to the silicon body 1 which is the drain region through the channel region 7 and the drift region 6. In order to lead the drain current flowing into the drain region to a surface of the silicon body 1, a part of the $P^+$-type silicon body 1 is left under a drain electrode 15 and connected with the drain electrode 15. The drain electrode 15 is electrically connected with the external drain terminal 3 (not shown).

FIG. 32A is a partial cross sectional view showing an example of a $P^+$-type high-concentration diffusion region 18 which is another example of a connection portion between the silicon body 1 (drain region) shown in FIG. 31 and the drain electrode 15. FIG. 32B is a partial cross sectional view showing yet another example of the connection portion. In this example, a trench 19 is formed to reach the silicon body 1 (drain region) and a buried conductive layer 20 is formed in the trench 19. As shown in FIGS. 31, 32A, and 32B, a drain current path for connecting the drain region formed on the rear surface side of the silicon body 1 with the drain electrode 15 formed to the principal surface of the silicon body 1 is provided in the silicon body 1 to form the external drain terminal 3 to the principal surface of the silicon body 1.

However, the inventor of the present invention found that the above-mentioned prior art has room for further improvement in view of the ON-resistance.

A length of the drain current path from the drain region to the drain electrode 15 is a length corresponding to a thickness of the drift region 6. The thickness of the drift region 6 is determined based on a designed withstand voltage of the vertical MOSFET. The thickness depends on, for example, an impurity concentration of the drift region 6 and an impurity concentration and a thickness of the channel region 7. A necessary thickness is, for example, approximately 2 μm to 3 μm. In order to reduce an ON-resistance of the semiconductor device 10, it is necessary to reduce a resistance value of the drain current path. When the silicon body 1 is to be used for the drain current path as shown in FIG. 31 without any modification, it is necessary to increase an impurity concentration of the silicon body 1 or to widen a cross sectional area of the drain current path to reduce a resistance value thereof. However, this is actually difficult.

When the drain current path is to be formed so as to have a low resistance in the deep high-concentration diffusion region 18 as shown in FIG. 32A, it is necessary to perform the ion implantation of impurities at a very high acceleration energy and to introduce the impurities into the high-concentration diffusion region 18 by long-time heat treatment. Therefore, manufacturing is not easy. In addition, the impurity concentration reduces in a deepest part of the high-concentration diffusion region 18, so it is likely to increase a resistance value between the drain electrode 15 and the silicon body 1.

The buried conductive layer 20 shown in FIG. 32B can be reduced in resistance as compared with the case of FIG. 32A. However, it is necessary to bury the conductive layer in a trench whose depth is approximately 2 μm to 3 μm. Even when the conductive layer is to be buried in the deep trench, a void occurs in the conductive layer or the film thickness of the conductive layer of the drain electrode becomes insufficient in a step portion. Therefore, it is likely to increase the resistance value.

SUMMARY

Hereinafter, features of the present invention will be described with reference to numerals and symbols used in DETAILED DESCRIPTION OF THE PREFERRED EMBODIMENTS. The numerals and symbols are enclosed in parentheses and added to make clear a correspondence relationship between the description of CLAIM and the description of DETAILED DESCRIPTION OF THE PREFERRED EMBODIMENTS. Note that the numerals and symbols should not be used for the interpretation of the technical scope of the invention described in CLAIMS.

In one feature of the present invention, there is provided a semiconductor device including a semiconductor region (drift region 21) of a first conductivity type, a first trench (gate trench 16), a second trench (drain contact trench 30), a channel region (7) of a second conductivity type, and a source region (8) of the first conductivity type. The first trench includes a gate insulating film (12) and a gate electrode (11) formed therein. The second trench has a depth substantially equal to a depth of the first trench and includes a drain electrode (15) formed therein.

According to the semiconductor device in one feature of the present invention, the drain contact trench is provided in a part of the drift region to make the depth thereof smaller than a conventional depth. The drain electrode is buried in the shallow drain contact trench, so a void can be prevented from occurring in the drain electrode or the film thickness of the conductive layer of the drain electrode can be prevented from becoming insufficient. A distance between the drain electrode and the drain region is reduced by the drain contact trench, so an impurity concentration of a drain contact region interposed between the drain contact trench and the drain region can be easily increased to reduce the ON-resistance.

In another feature of the present invention, there is provided a method of manufacturing a semiconductor device, including simultaneously forming a first trench (gate trench 16) and a second trench (drain contact trench 30) in a semiconductor region (drift region 21) of a first conductivity type. The first trench includes a gate insulating film (12) and a gate electrode (11) formed therein. The second trench includes a drain electrode (15) formed therein.

According to the semiconductor device manufacturing method in another feature of the present invention, the drain contact trench into which the drain electrode is buried is formed simultaneously with the formation of the gate trench, so the number of steps does not increase.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 32A and 32B are partial cross sectional views showing examples of a drain electrode portion of the conventional semiconductor device 10.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Hereinafter, preferred embodiments of the present invention will be described with reference to the attached drawings. Constituent elements which are not particularly different from one another in view of functions are expressed by the same symbols. However, this does not mean "completely the same" and includes various modified cases such as the case of different conductivity types and the case of different pattern shapes.

Embodiment 1

Figure 1:
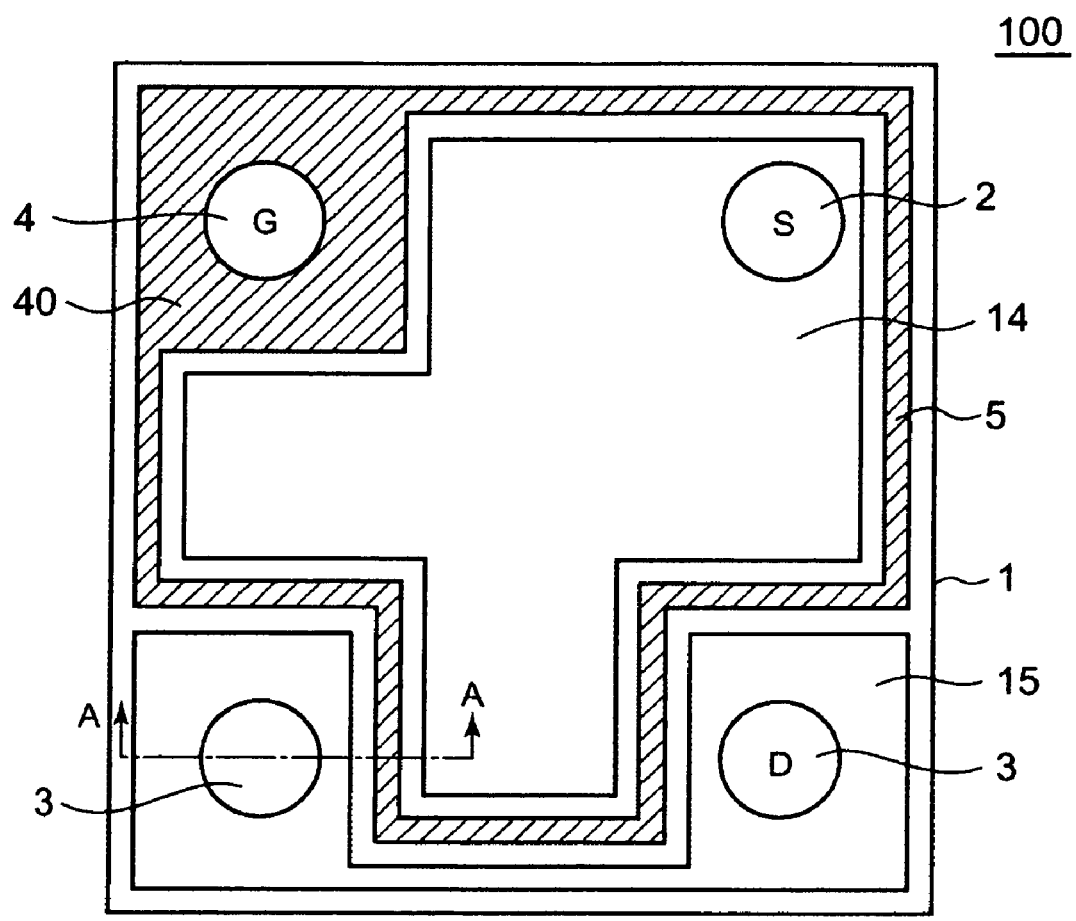
FIG. 1 is an explanatory plan view showing a semiconductor device according to Embodiment 1 of the present invention.

FIG. 1 is an explanatory plan view showing a semiconductor device 100 according to Embodiment 1 of the present invention. An external source terminal 2, an external drain terminal 3, and an external gate terminal 4 are formed on a surface of the silicon body 1 at three corners. The external source terminal 2 is electrically connected with a source electrode 14 formed on a central portion of the surface of the silicon body 1. One or a plurality of transistor cells (not shown) is formed under the source electrode 14 in the entire region substantially equal to the region for the source electrode 14 to form an active cell region. A peripheral region is formed so as to surround the active cell region. A gate wiring 5 and a gate pad 40 are formed in the peripheral region so as to surround the source electrode 14. The gate pad 40 is electrically connected with the external gate terminal 4. A drain electrode 15 is formed outside the gate wiring 5 and connected with the external drain terminal 3.

Figure 2:
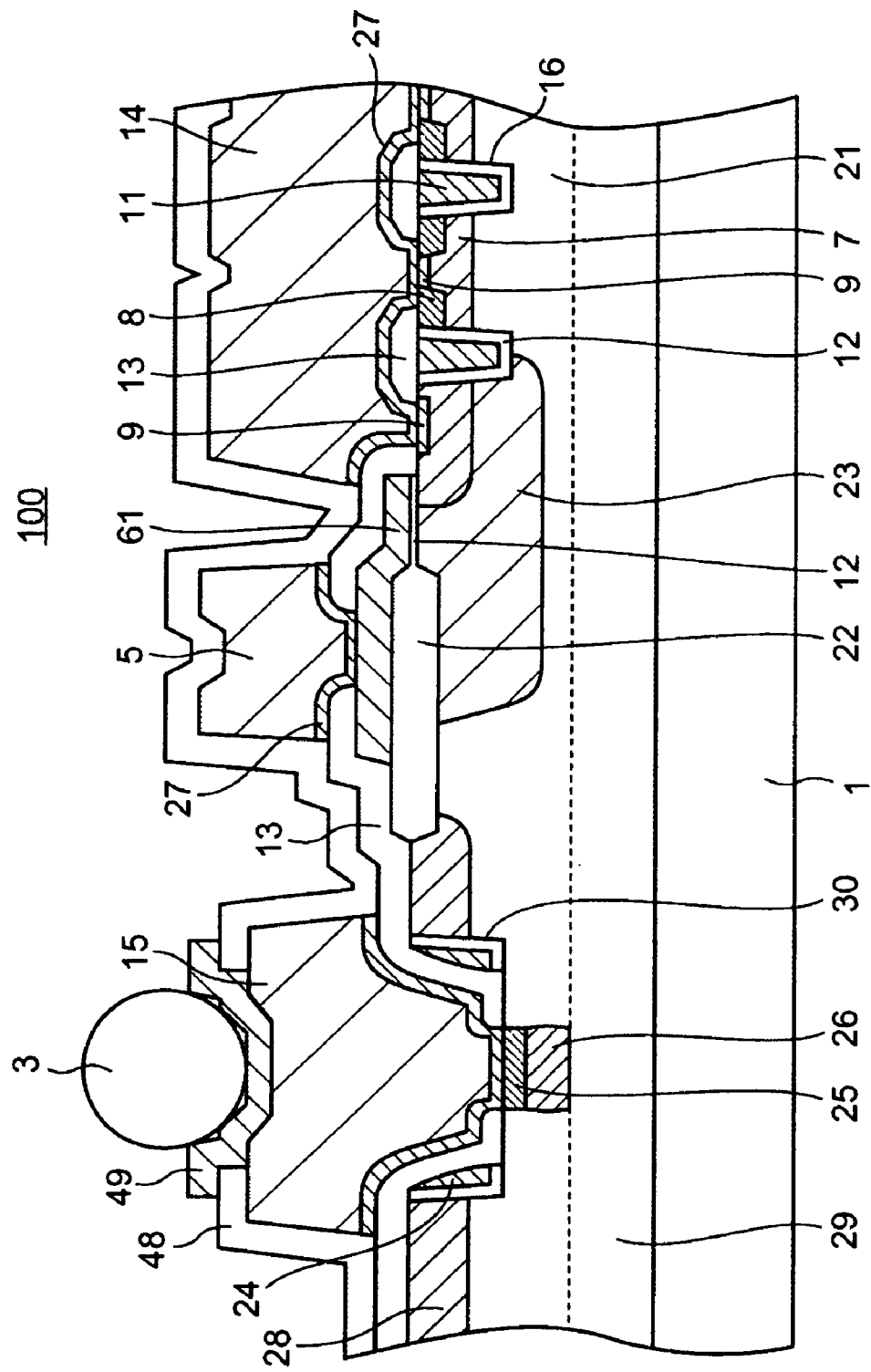
FIG. 2 is a cross sectional view taken along the line A-A of FIG. 1.
Figure 3:
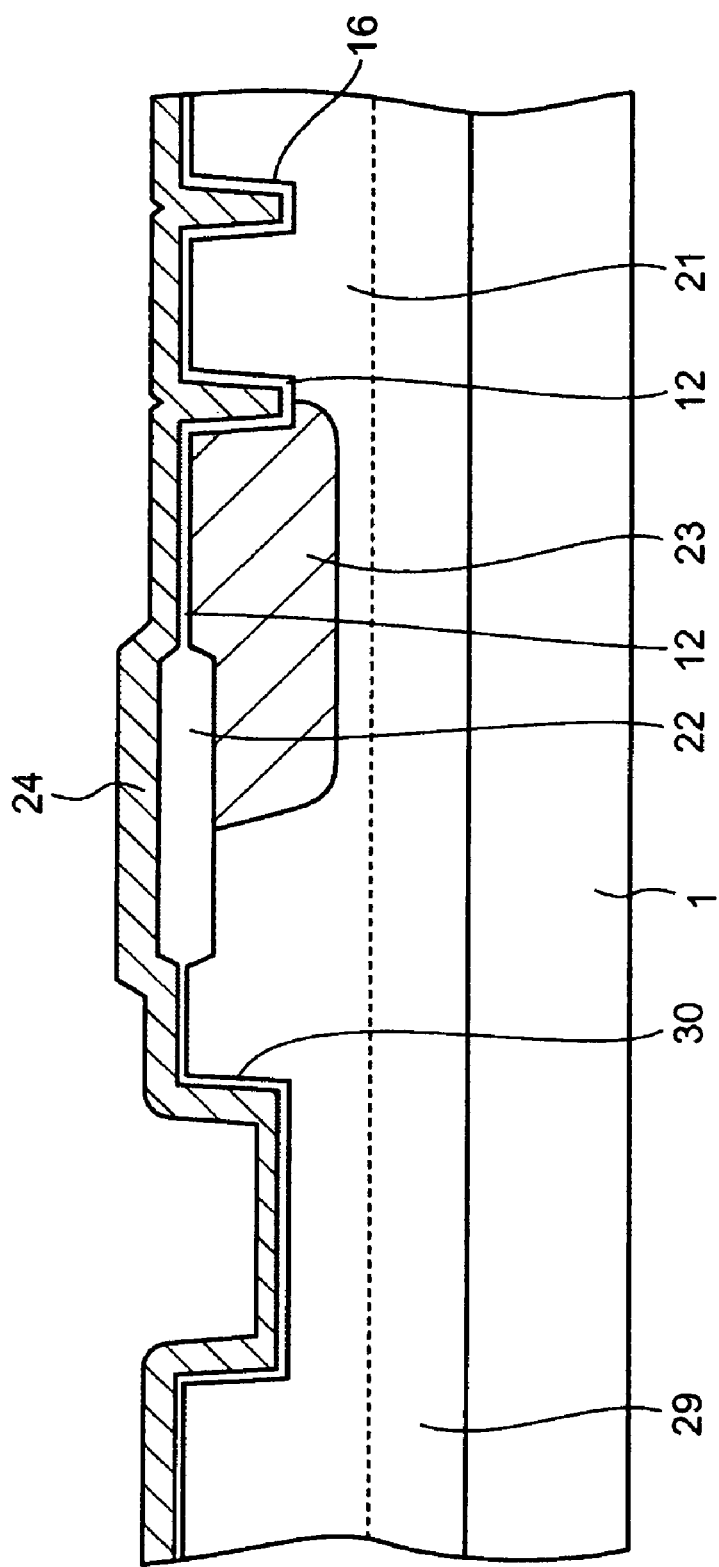
FIG. 3 is an explanatory cross sectional view taken along the line A-A, showing a process of manufacturing the semiconductor device of FIG. 1.

FIG. 2 is a cross sectional view taken along the line A-A of FIG. 1. In the central portion of FIG. 2, a local-oxidation-of-silicon (LOCOS) oxide film 22 is formed as an interface between the active cell region and the peripheral region. The active cell region located on the right side of the LOCOS oxide film 22 includes the one or the plurality of trench gate type transistor cells and the source electrode 14. The peripheral region includes the LOCOS oxide film 22, the gate wiring 5, the external drain terminal 3, the drain electrode 15, and a current path for leading a drain current from a region of the silicon body 1 which is a drain region. For easy understanding, a size and a shape of each part shown in FIG. 2 are different from those of each part of an actual semiconductor device.

The case where the conductivity type of the semiconductor device 100 according to the present invention is an N-type will be described. An $N^-$-type epitaxial layer serving as a drift region 21 is formed on the silicon body 1 of an $N^+$-type. An N-type diffused layer 29 to which impurities are diffused from the $N^+$-type silicon body 1 to establish a concentration gradient is formed in a bottom portion of the epitaxial layer. The diffused layer 29 is lower in impurity concentration than the region of the silicon body 1 which is the drain region and is higher in impurity concentration than the drift region 21. The diffused layer 29 serves as a part of the drain region.

The active cell region includes a P-type channel region 7 and $N^+$-type source regions 8. One or a plurality of gate trenches 16 (first trench) extends from the surfaces of the source region 8 and the channel region 7 to reach the drift region 21. A gate insulating film 12 and a gate electrode 11 are formed in the gate trench 16. An interlayer insulating film 13 covers the gate trench 16 and a part of the source region 8. The source electrode 14 is formed on the interlayer insulating film 13 through a barrier metal layer 27. The source electrode 14 is electrically connected with the source regions 8 and electrically connected with the channel region 7 through contact diffusion regions 9. The drain current flows from the silicon body 1 into the source electrode 14 through the diffused layer 29, the drift region 21, a channel which is formed in an adjacent area of the gate trench 16 and formed in the channel region 7, and the source region 8.

A P-type well 23 extends from the outermost gate trench 16 to the middle of the LOCOS oxide film 22 to increase a withstand voltage with respect to the source region 8. The gate trench 16 and the interlayer insulating film 13 extend in a direction to the surface of the paper of FIG. 2 and are formed in a stripe or mesh pattern as viewed from an upper surface of the semiconductor 100. The gate trenches 16 shown in FIG. 1 may be joined to each other to form a single structure. The one or the plurality transistor cells are formed in a region sandwiched between the gate trenches 16. In the case of the plurality of transistor cells, the transistor cells are connected in parallel. The gate electrode 11 is connected with a gate lead wiring 61 at a terminal portion of the gate trench 16 to be electrically connected with the gate wiring 5.

A drain contact trench 30 (second trench) is formed under the drain electrode 15. The drain contact trench 30 has a depth substantially equal to a depth of the gate trench 16. A P-type diffusion region 28 formed simultaneously with the P-type channel region 7 is located in the periphery of the drain contact trench 30. The drain contact trench 30 extends through the P-type diffusion region 28. An $N^+$-type first drain contact region 25 and an $N^+$-type second drain contact region 26 are formed in a part of the drift region 21 which is located under the drain contact trench 30. The $N^+$-type second drain contact region 26 is in contact with the N-type diffused layer 29. The drain electrode 15 is connected with the first drain contact region 25 at the bottom of the drain contact trench 30. The first drain contact region 25 and the second drain contact region 26 serve in cooperation as the drain contact region.

According to the present invention, the drain contact trench 30 is shallowly formed in the part of the drift region 21. Therefore, even when the drain electrode 15 is buried into the drain contact trench 30, a void can be prevented from occurring or the film thickness of the conductive layer of the drain electrode can be prevented from becoming insufficient (thinner). The drain contact region (first drain contact region 25 and second drain contact region 26) is formed in the drift region 21 left between the drain contact trench 30 and the drain region to reduce a resistance value between the drain electrode 15 and the drain region. A distance between the drain electrode 15 and the drain region is reduced by the depth of the drain contact trench 30, so it is unnecessary to deeply form the drain contact region. Therefore, a high impurity concentration can be maintained up to a bottom portion of the drain contact region to reduce the resistance value. For example, when a withstand voltage is approximately 20 V, a necessary thickness of the $N^-$-type epitaxial layer is approximately 3 μm. Even when the diffused layer 29 is formed at a thickness of approximately 1 μm, the drift region 21 has a depth of approximately 2 μm. According to the present invention, it is preferable to form the drain contact trench 30 at a depth of approximately 1.1 μm to 1.2 μm and to form the first drain contact region 25 and the second drain contact region 26 at a remaining depth of approximately 0.8 μm to 0.9 μm, thereby reducing the resistance.

Next, a process for manufacturing the semiconductor device 100 will be described with reference to cross sectional views of FIGS. 3 to 9. The process will be described with reference to FIG. 3. The $N^-$-type epitaxial layer is formed on the $N^+$-type silicon body 1 at a thickness of approximately 3 μm. Then, the LOCOS oxide film 22 for cell separation is formed. During heat treatment for forming the LOCOS oxide film 22, N-type impurities are diffused from the $N^+$-type silicon body 1 to the $N^-$-type epitaxial layer to form the N-type diffused layer 29. The N-type diffused layer 29 is normally formed when the LOCOS oxide film 22 is formed. The thickness of the N-type diffused layer 29 is gradually increased by subsequent heat treatment and a final thickness thereof becomes approximately 1 μm. Then, the gate trench 16 and the drain contact trench 30 are simultaneously formed by etching. When an opening width of the gate trench 16 is set to, for example, approximately 0.15 μm to 0.5 μm and a depth of the gate trench 16 is set to approximately 1 μm, a depth of the drain contact trench 30 is approximately 1.1 μm to 1.2 μm which is slightly deeper than the depth of the gate trench 16 because the drain contact trench 30 has a wider opening width of, for example, approximately 10 μm to 100 μm. Then, the P-type well 23 is formed to extend from the outermost gate trench 16 to the middle of the LOCOS oxide film 22. Then, the gate insulating film 12 is formed on the surfaces of the gate trench 16 and the drain contact trench 30. A polycrystalline silicon layer 24 is formed on the gate insulating film 12. An inner portion of the gate trench 16 is filled with the polycrystalline silicon layer 24. The drain contact trench 30 has a wider opening portion, so the polycrystalline silicon layer 24 is formed along a step shape. An impurity such as phosphorus is introduced into the polycrystalline silicon layer 24 at a higher concentration of, for example, approximately $1 \times 10^{20}$ $cm^{-3}$ to $1 \times 10^{22}$ $cm^{-3}$.

Figure 4:
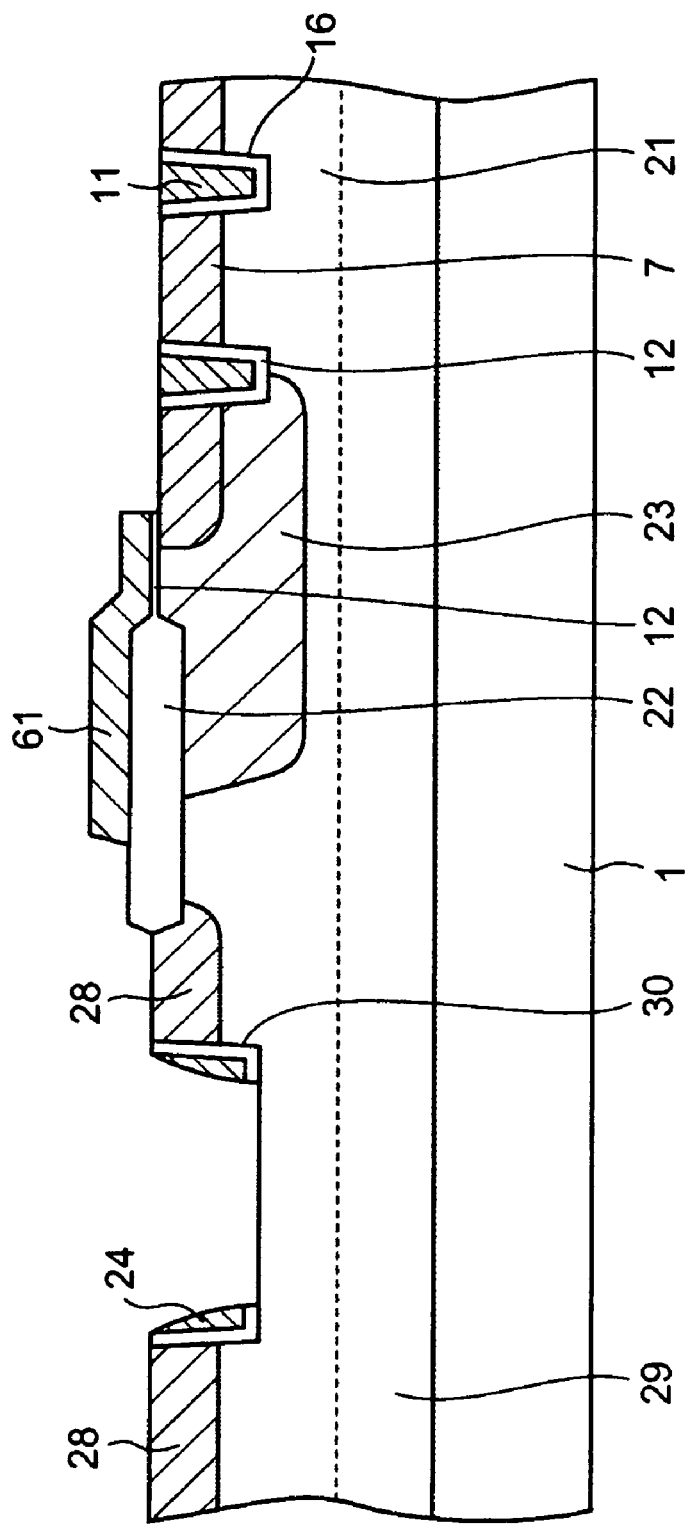
FIG. 4 is an explanatory cross sectional view taken along the line A-A, showing a process of manufacturing the semiconductor device of FIG. 1.

Next, the process will be described with reference to FIG. 4. The polycrystalline silicon layer 24 is patterned to form the gate electrodes 11 and the gate lead wiring 61. At this time, a part of the polycrystalline silicon layer 24 is left on a side wall of the drain contact trench 30. When a part of the gate insulating film 12 formed under the polycrystalline silicon layer 24 is left in a connection region between the drain electrode 15 and the first drain contact region 25, the resistance value increases. Therefore, it is necessary to prevent the part of the polycrystalline silicon layer 24 and the gate insulating film 12 from being left on the bottom surface of the drain contact trench 30. In other words, the opening width of the drain contact trench 30 is determined such that the drain electrode 15 can be electrically connected with the drain region 21 at the bottom surface of the drain contact trench 30 even when the part of the polycrystalline silicon layer 24 is left on the side wall of the drain contact trench 30. The part of the polycrystalline silicon layer 24 which is left on the side wall of the drain contact trench 30 is also useful to improve a coverage of each of the interlayer insulating film 13, the barrier metal layer 27, and the conductive film serving as the drain electrode 15. After that, P-type impurity ions are implanted to form the channel region 7 in the active cell region. Simultaneously, the P-type diffusion region 28 is formed in an peripheral region of the semiconductor device 100 which includes the drain contact trench 30. The P-type diffusion region 28 is not necessary. However, in order to prevent the P-type diffusion region 28 from being formed in the region, it is necessary to further perform a mask pattern forming step. An insulating film and the like are prevented from being formed on a semiconductor wafer dicing line to prevent the generation of dust or the like. Therefore, it is necessary to prevent the LOCOS oxide film 22 from being formed in the peripheral region, so the mask pattern forming step of preventing the P-type diffusion region 28 from being formed in the peripheral region is required. Note that there is no inconvenience caused by the presence of the P-type diffusion region 28.

Figure 5:
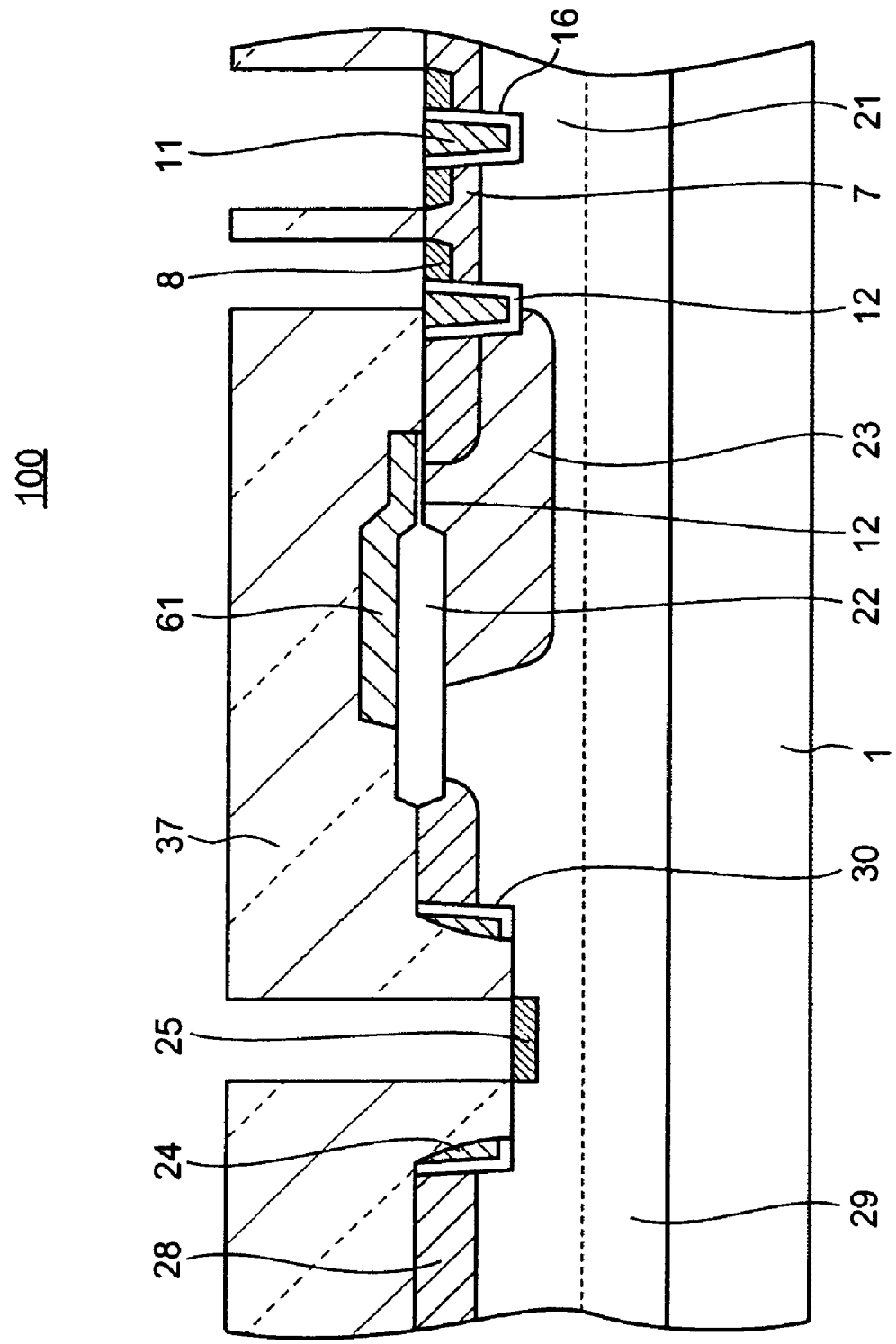
FIG. 5 is an explanatory cross sectional view taken along the line A-A, showing a process of manufacturing the semiconductor device of FIG. 1.

Next, as shown in FIG. 5, $N^+$-type impurities are ion-implanted using a photo resist 37 as a mask to form the source regions 8 and the first drain contact region 25. After that, the photo resist 37 is removed and heat treatment is performed to activate the impurities. The heat treatment may be omitted to activate the impurities by subsequent heat treatment.

Figure 6:
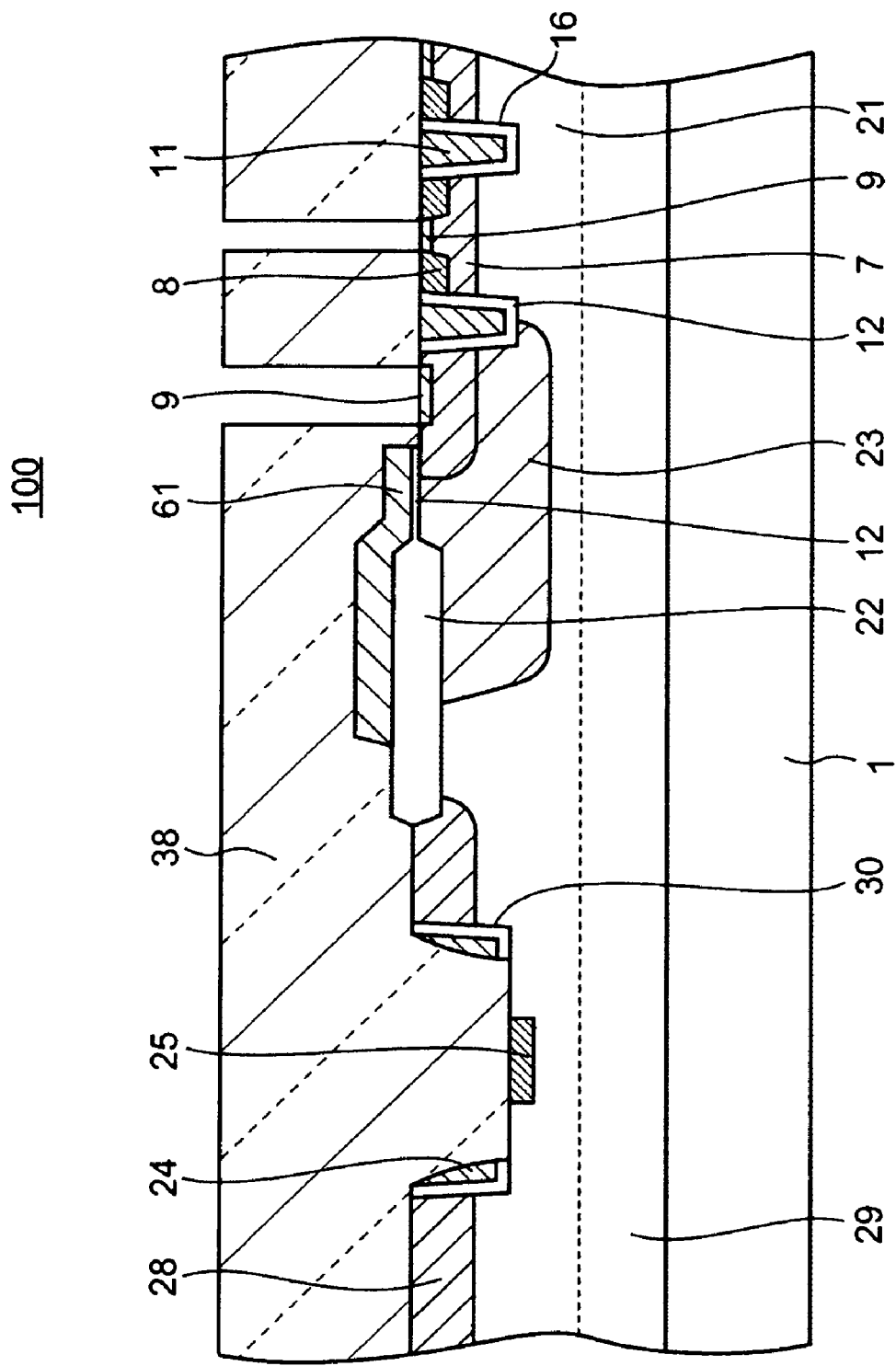
FIG. 6 is an explanatory cross sectional view taken along the line A-A, showing a process of manufacturing the semiconductor device of FIG. 1.

Next, as shown in FIG. 6, $P^+$-type impurities are ion-implanted using a photo resist 38 as a mask to form the contact diffusion regions 9. After that, the photo resist 38 is removed and heat treatment is performed to activate the impurities. The process shown in FIG. 6 may be performed before the process shown in FIG. 5. The heat treatment for activating the $N^+$-type impurities for the source regions 8 and the heat treatment for activating the $P^+$-type impurities for the contact diffusion regions 9 may be simultaneously performed. Alternatively, the heat treatment may be omitted to activate the impurities by subsequent heat treatment.

Figure 7:
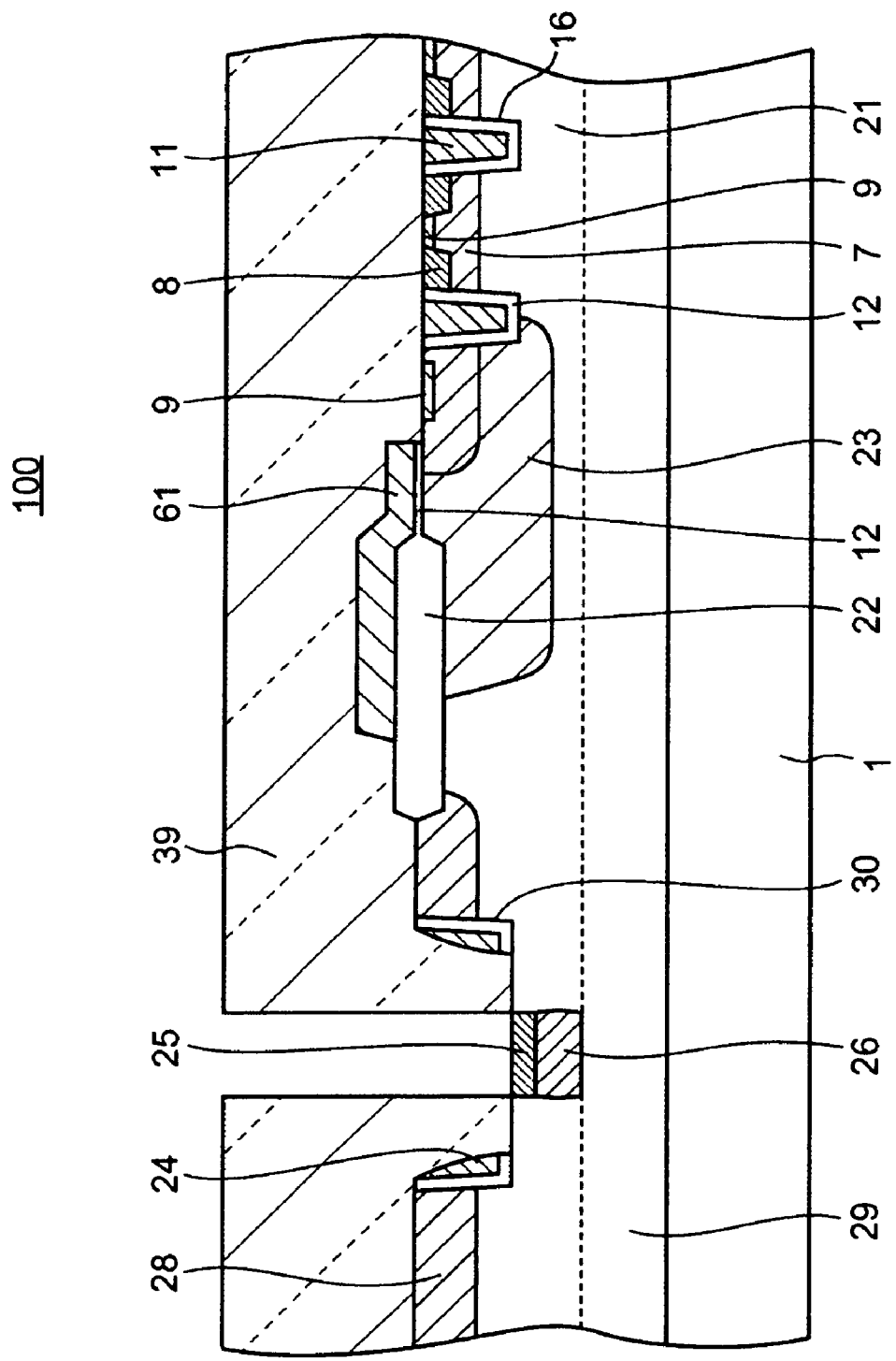
FIG. 7 is an explanatory cross sectional view taken along the line A-A, showing a process of manufacturing the semiconductor device of FIG. 1.

Next, as shown in FIG. 7, ion implantation is performed using a photo resist 39 as a mask such that N-type impurities for forming the second drain contact region 26 reach the diffused layer 29. In order to reduce the ON-resistance, the impurity concentration of each of the first drain contact region 25 and the second drain contact region 26 is set to a value substantially equal to or larger than the impurity concentration of the diffused layer 29. The following may be performed. An opening portion for ion-implanting the $N^+$-type impurities to form the first drain contact region 25 is not provided in the photo resist 37 shown in FIG. 5 and the ion implantation of the $N^+$-type impurities for the first drain contact region 25 and the ion implantation of the N-type impurities for the second drain contact region 26 are performed in this process. After that, the photo resist 39 is removed and heat treatment is performed to activate the impurities. The heat treatment for activating the impurities may be performed simultaneously with the heat treatment for activating the impurities for the source regions 8 and the heat treatment for activating the impurities for the contact diffusion regions 9. The thickness of the diffused layer 29 is substantially determined by the heat treatment.

In the above-mentioned example, in order to minimize the ON-resistance, the second drain contact region 26 is formed in contact with the diffused layer 29. Even when the drift region 21 is slightly left between the second drain contact region 26 and the diffused layer 29, the ON-resistance is suppressed to a low value. Even when the second drain contact region 26 is not formed, there is an ON-resistance reduction effect because the first drain contact region 25 is formed. In this case, the process shown in FIG. 7 is unnecessary, so the number of manufacturing steps can be reduced.

Figure 8:
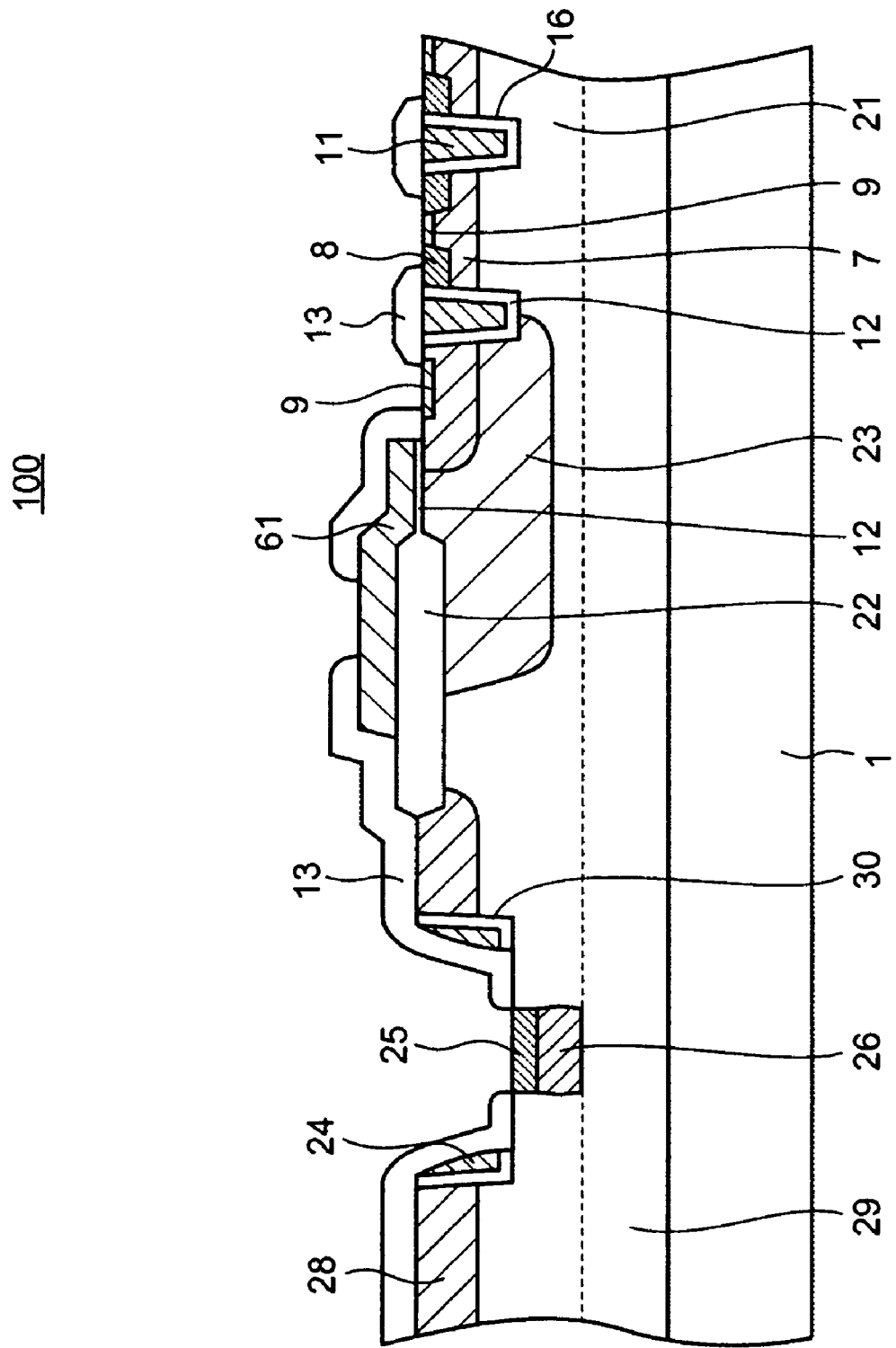
FIG. 8 is an explanatory cross sectional view taken along the line A-A, showing a process of manufacturing the semiconductor device of FIG. 1.

Next, an insulating film such as a BPSG film is formed on the entire surface and contact holes are provided in the insulating film by patterning to form the interlayer insulating films 13 as shown in FIG. 8. The interlayer insulating films 13 may be flattened by reflow. In this case, the thickness of the diffused layer 29 is finally determined by the heat treatment for reflow.

Figure 9:
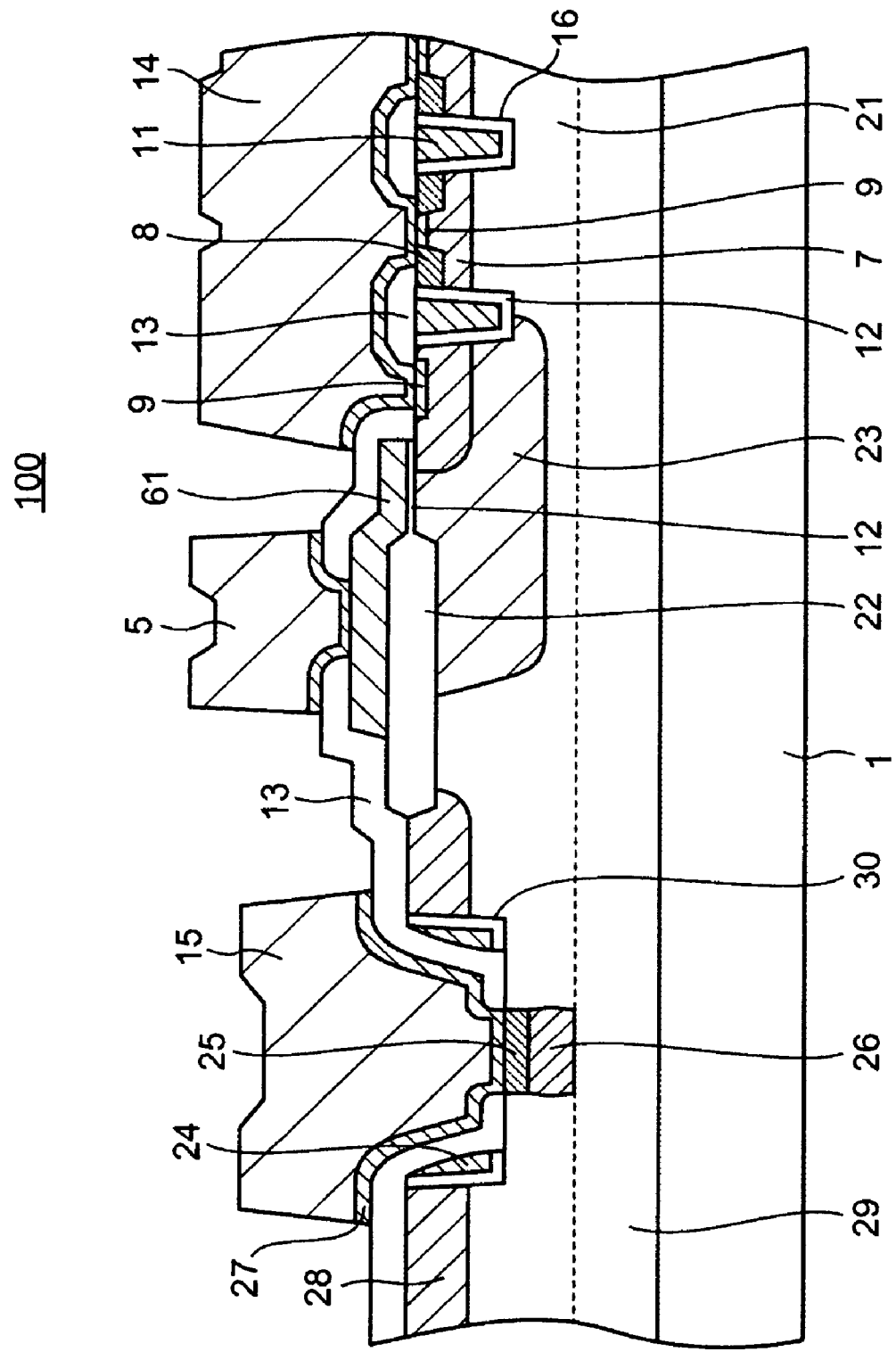
FIG. 9 is an explanatory cross sectional view taken along the line A-A, showing a process of manufacturing the semiconductor device of FIG. 1.

Next, the barrier metal layer 27 such as a titanium/titanium nitride (Ti/TiN) layer and a conductive layer such as an aluminum silicon copper (AlSiCu) layer or an AlCu layer are formed on the entire surface by a sputtering method and then patterned to form the drain electrode 15, the gate wiring 5, and the source electrode 14 as shown in FIG. 9. In order to reduce a resistance component, the thickness of the conductive layer such as the AlSiCu layer or the AlCu layer is preferably set to a larger value. The conductive layer is normally formed at approximately 4 μm to 6 μm. The barrier metal layer 27 and the drain electrode 15 are formed in the drain contact trench 30 to be connected with the first drain contact region 25 which is a part of the drain contact region, so the barrier metal layer 27 and the drain electrode 15 serve as the drain electrode. After that, if necessary, a cover insulating film 48 and an under-bump-metal (UBM) 49 which is connectable by soldering are formed, and the external source terminal 2, the external drain terminal 3, and the external gate terminal 4 are formed using solder balls, solder bumps, and the like. Therefore, the semiconductor device 100 as shown in FIGS. 1 and 2 can be produced.

According to the semiconductor device 100, the drain contact trench 30 and the gate trench 16 are simultaneously formed by etching, so the number of etching steps does not increase. When the drain contact trench 30 is to be formed to reach the diffused layer 29, it is necessary to further perform an etching step different from the step of etching the gate trench 16. Therefore, it is not easy to bury the conductive layer in the deep drain constant trench 30 because a void may occur or the film thickness of the conductive layer of the drain electrode may become insufficient. However, according to the present invention, the drain contact trench 30 is formed at the shallow depth substantially equal to the depth of the gate trench 16, so there is no fear that a void occurs or the film thickness of the conductive layer of the drain electrode becomes insufficient. Unlike the conventional case, it is unnecessary to deeply form the drain contact region. Therefore, manufacturing can be realized by a slight modification of a patterning mask and the execution of an additional diffusion layer forming process without using a specific manufacturing apparatus such as a high-energy ion implantation apparatus.

Figure 10:
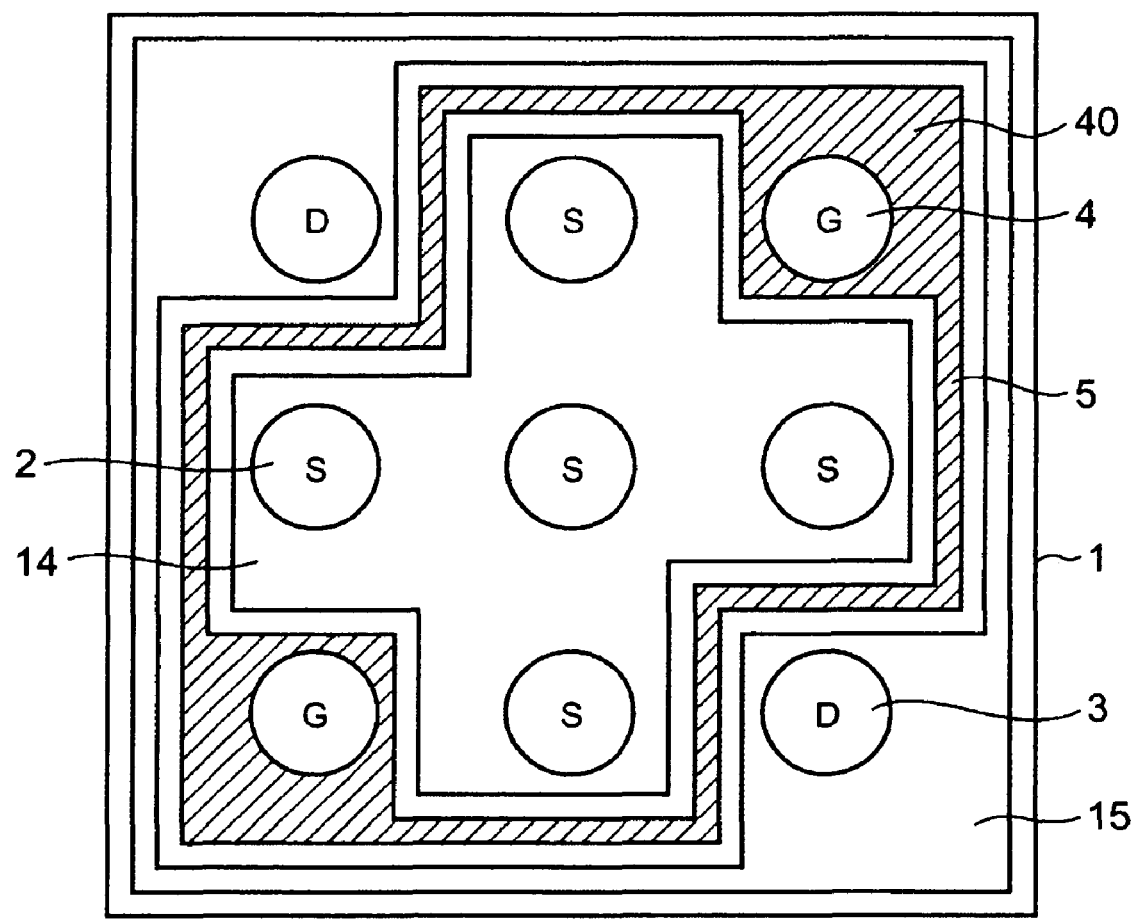
FIG. 10 is an explanatory plan view showing a modified example of the semiconductor device according to Embodiment 1 of the present invention.

FIG. 10 is an explanatory plan view showing a modified example of the semiconductor device 100. In the case of FIG. 1, the drain electrode 15 is formed on the lower side of the figure. In contrast to this, in the case of FIG. 10, the drain electrode 15 is formed to surround the gate wiring 5 and the gate pad 40. The external drain terminals 3 are formed on the upper left region and the lower right region which are diagonal to each other. When the drain electrode 15 is laid out so as to annularly surround the peripheral region of the semiconductor device 100, the drain electrode 15 can be made to serve as an equipotential ring (EQR) for improving the withstand voltage. The equipotential ring will be described later. FIG. 10 shows a layout in which the external source terminals 2 are uniformly arranged on the central region, the external drain terminals 3 are arranged in a first diagonal line, and the external gate terminals 4 are arranged in a second diagonal line crossing the first diagonal line. Electrons flow from the entire surface of the source electrode 14 into the $N^+$-type silicon body 1 (from the front surface side of the page to the rear surface side thereof) through the source region 8, the channel region 7, the drift region 21, and the diffused layer 29. Then, the electrons flow through the silicon body 1 in the lateral direction to travel toward the second drain contact regions 26 formed on the upper left region and the lower right region. Then, the electrons pass through the second drain contact regions 26 and the first drain contact regions 25 and flow out to the drain electrode 15 (from the rear surface side of the page to the front surface side thereof). In the layout shown in FIG. 1, the drain electrode is formed on one side of the semiconductor device 100. Therefore, electrons flowing from the source region 8 located on the far side from the drain electrode 15 into the silicon body 1 travel through the silicon body 1 over a long distance (high resistance). Therefore, the ON-resistance becomes somewhat higher. In contrast to this, according to the layout shown in FIG. 10, an average distance between the source region 8 and the drain electrode 15 shortens, so the ON-resistance can be reduced.

Figure 11:
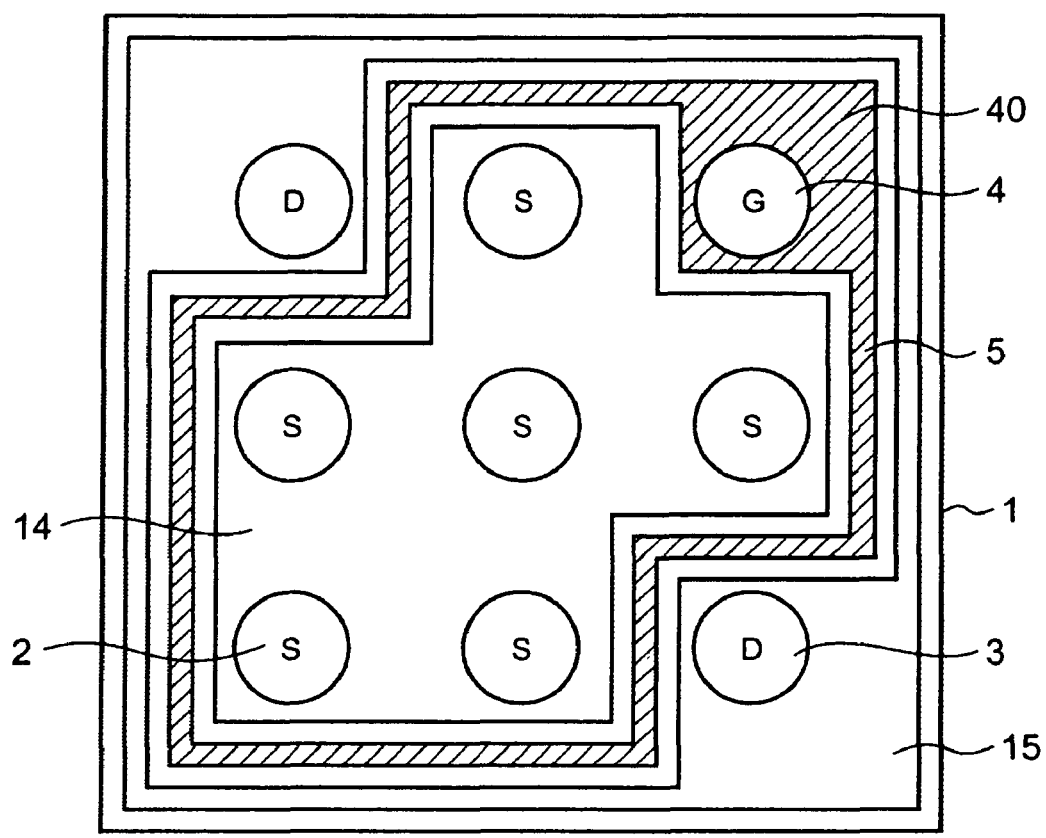
FIG. 11 is an explanatory plan view showing another modified example of the semiconductor device according to Embodiment 1 of the present invention.

FIG. 11 shows a layout in which a part of the gate pad 40 located on the lower left region of FIG. 10 is removed to widen an area of the source electrode 14. Because the area of the source electrode 14 widens, the ON-resistance can be further reduced.

Figure 12:
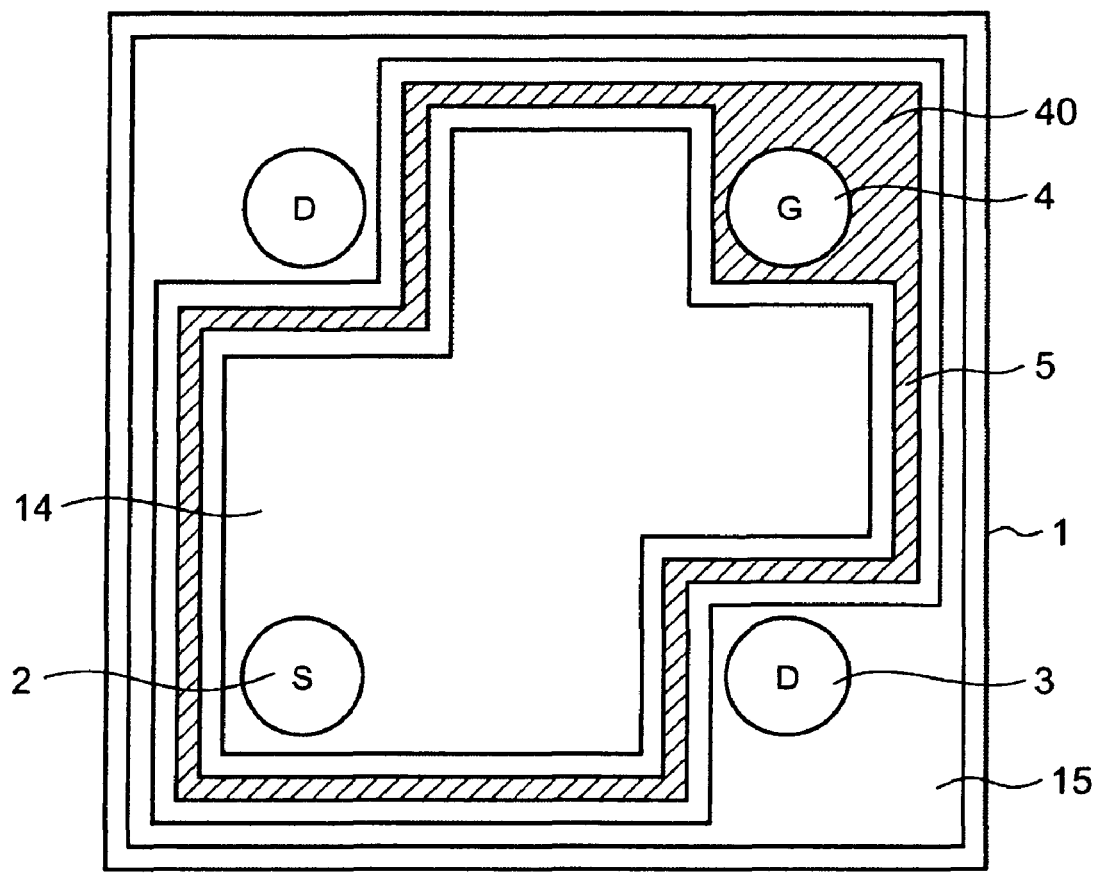
FIG. 12 is an explanatory plan view showing another modified example of the semiconductor device according to Embodiment 1 of the present invention.

FIG. 12 shows a layout in which the number of external source terminals 2 shown in FIG. 11 is reduced to provide only an external source terminal located on the lower left region. In the case of a large-area semiconductor device such as a device for large current use, the plurality of external source terminals 2 are preferably provided as shown in FIG. 11. In the case of a semiconductor device whose drain current is relatively small and whose area is small, the number of external source terminals 2 is preferably reduced to one to suppress a cost.

Figure 13:
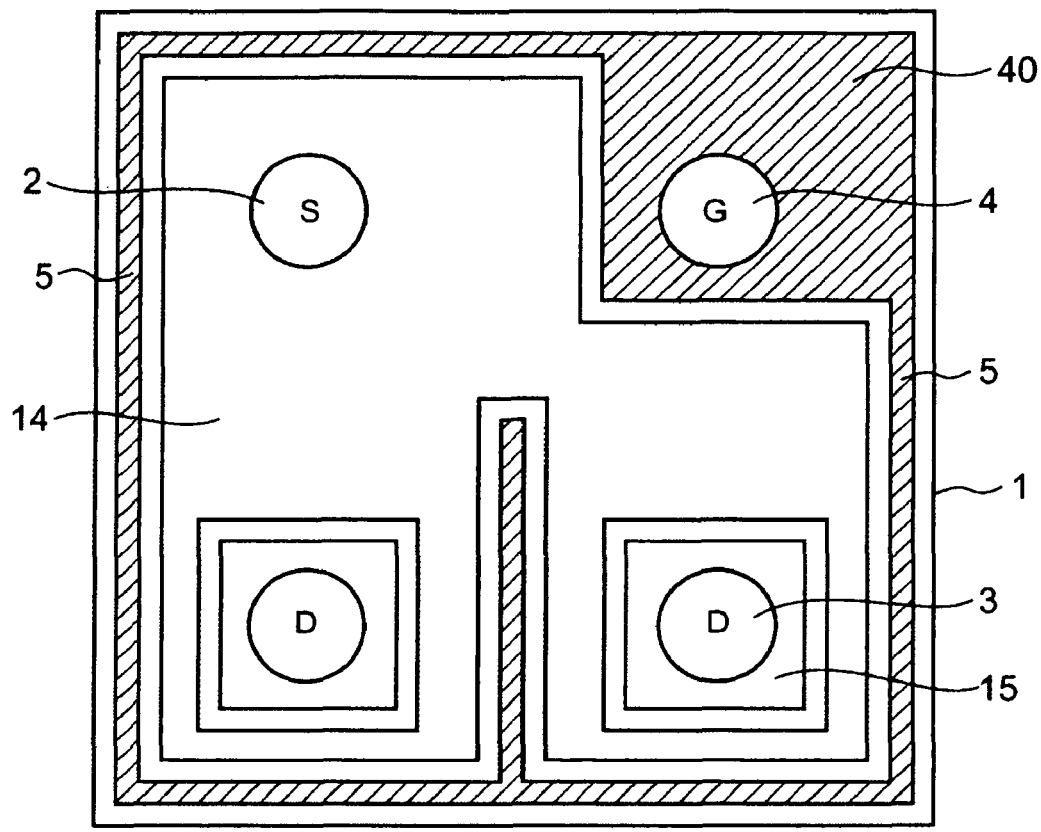
FIG. 13 is an explanatory plan view showing another modified example of the semiconductor device according to Embodiment 1 of the present invention.

FIG. 13 shows a layout in which a part of the gate wiring 5 extends to the central region of the semiconductor device in order to reduce a gate resistance. The drain electrode 15 does not necessarily continuously extend as a single layer. A plurality of island-like drain electrodes may be provided as in such a layout.

Figure 14:
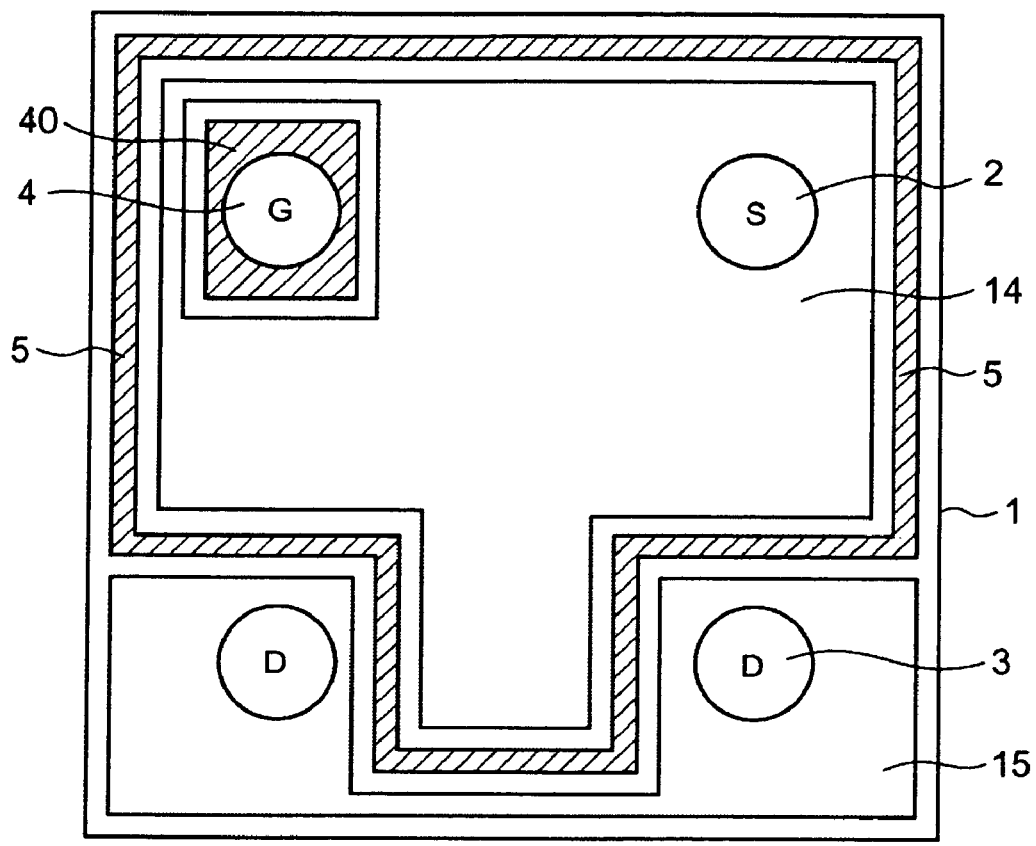
FIG. 14 is an explanatory plan view showing another modified example of the semiconductor device according to Embodiment 1 of the present invention.

FIG. 14 shows a layout in which the gate wiring 5 and the gate pad 40 are discontinuous to each other. The gate wiring 5 and the gate pad 40 are electrically connected with each other through the gate electrode 11 formed in a lower layer (not shown).

Embodiment 2

Figure 15:
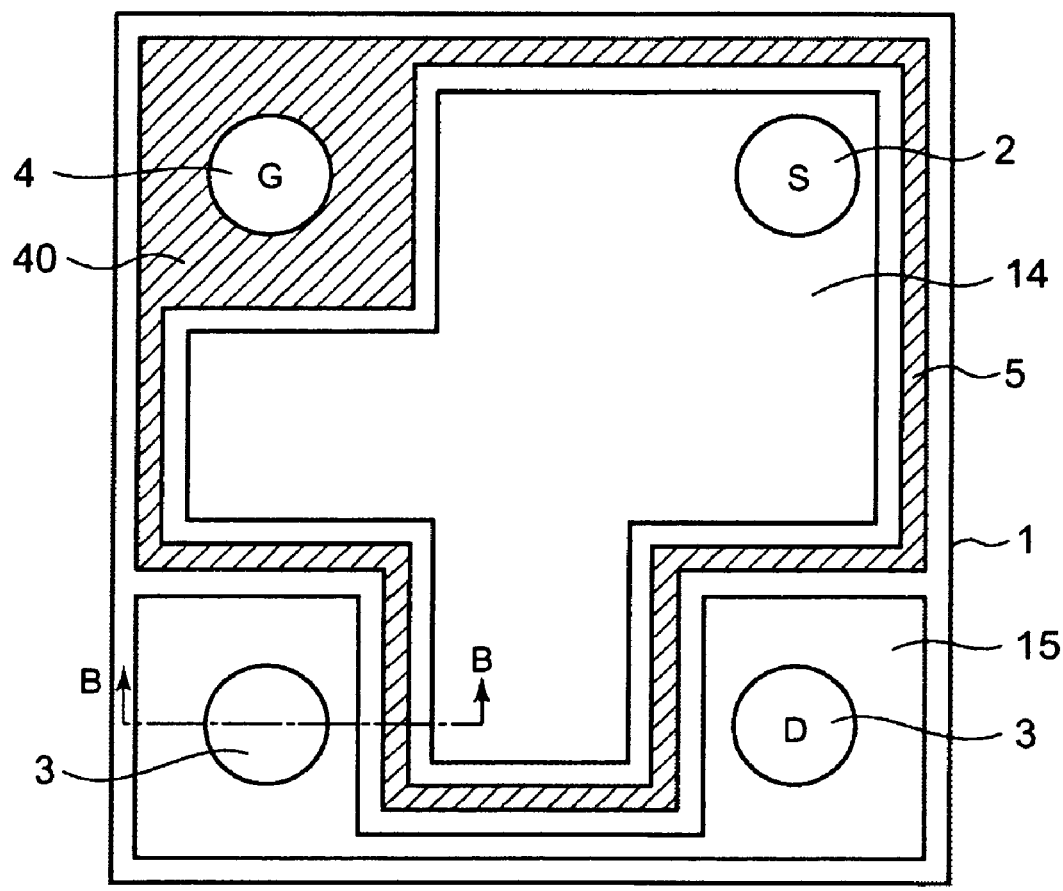
FIG. 15 is an explanatory plan view showing a semiconductor device according to Embodiment 2 of the present invention.

FIG. 15 is an explanatory plan view showing a semiconductor device 200 according to Embodiment 2 of the present invention. In order to make different points clear, a plan layout of the semiconductor device 200 is identical to that of the semiconductor 100.

Figure 16:
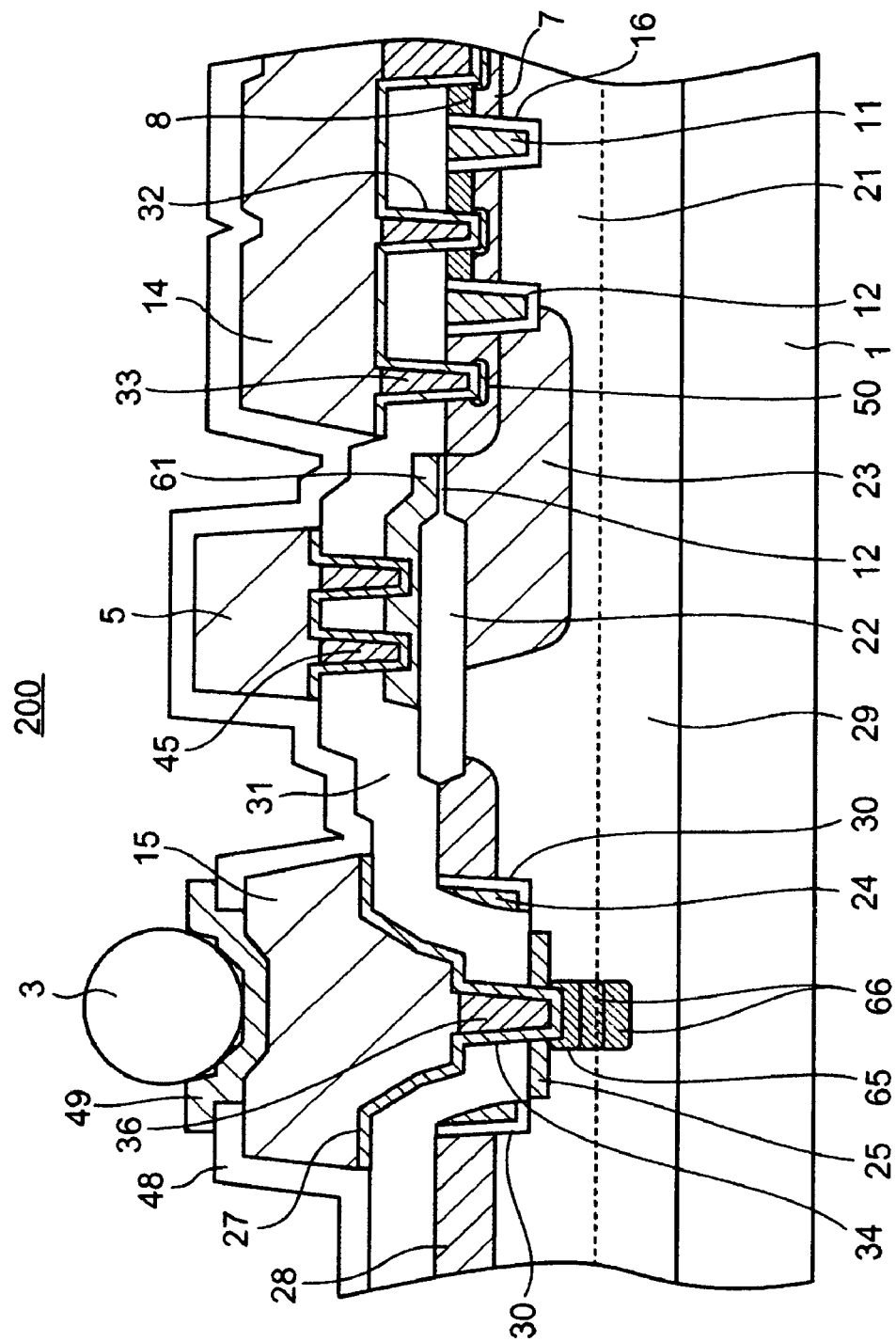
FIG. 16 is a cross sectional view taken along the line B-B of FIG. 15.

FIG. 16 is a cross sectional view taken along the line B-B of FIG. 15. A point significantly different from the semiconductor device 100 is that a drain contact trench is formed of the first drain contact trench 30 (second trench) formed as in the case of the semiconductor device 100 and a second drain contact trench 34 (third trench) deeper than the first drain contact trench 30. In the semiconductor device 200, the source electrode 14 is connected with the source region 8 and the channel region 7 through a contact trench 32 (fourth trench) and a contact plug 33. The contact trench 32 is formed in the interlayer insulating film 31, the source region, and an upper part of the channel region 7. The contact plug 33 which is a conductive layer is formed in the contact trench 32. The second drain contact trench 34 is formed simultaneously with the constant trench 32 to provide the second drain contact trench 34 deeper than the first drain contact trench 30 therein. The depth of the drain contact trench of the semiconductor device 100 corresponds to the depth of the first drain contact trench 30. In contrast to this, the depth of the drain contact trench of the semiconductor device 200 corresponds to a depth to the position of the bottom surface of the second drain contact trench 34. A distance (thickness) of a remaining drift region 21 is shortened because of the second drain contact trench 34. Therefore, the drain contact region (specifically, the second contact region 65 and third drain contact regions 66) can be formed closer to the drain region as compared with the case of the semiconductor device 100, so the resistance value can be further reduced.

Figure 17:
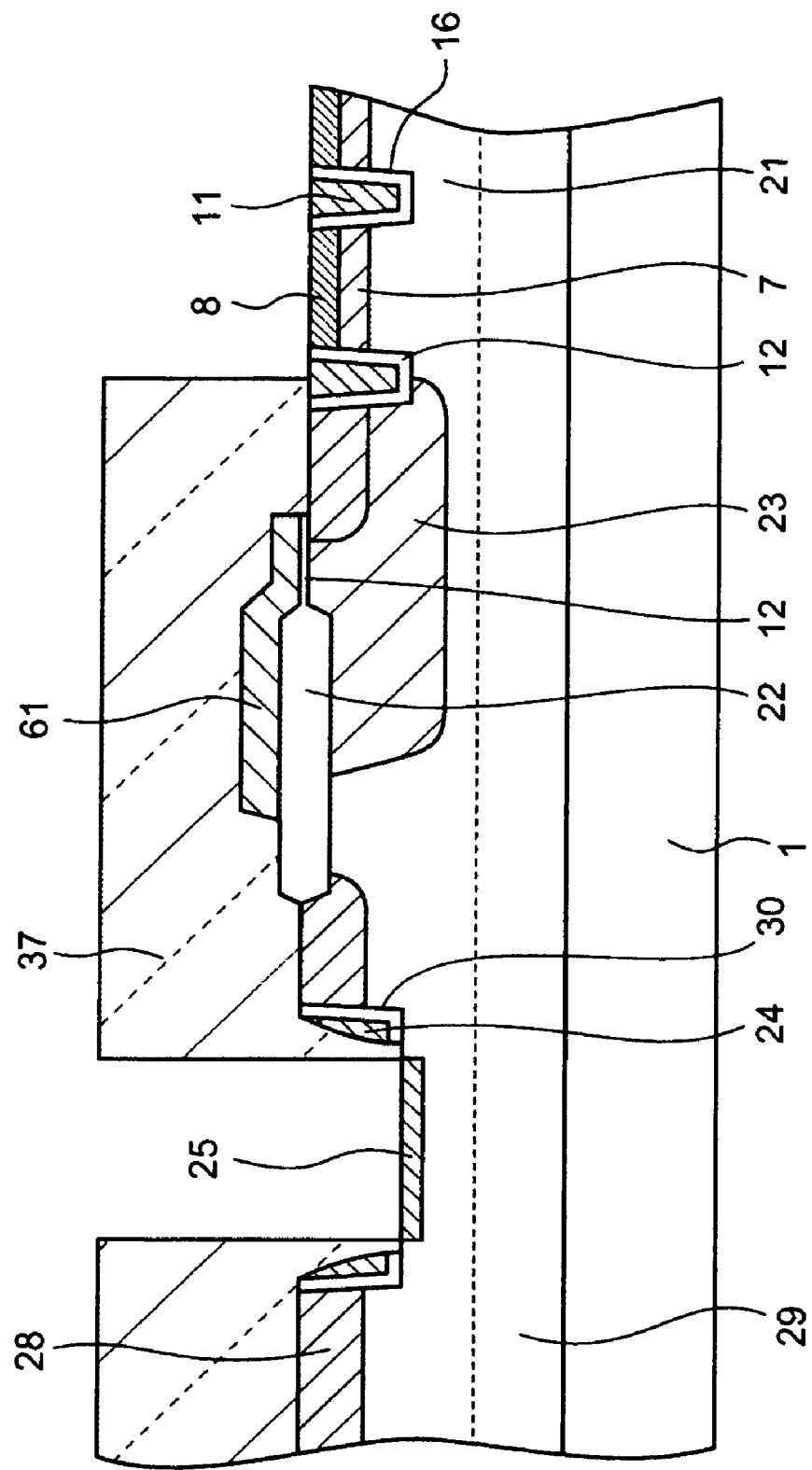
FIG. 17 is an explanatory cross sectional view taken along the line B-B, showing a process of manufacturing the semiconductor device of FIG. 15.

Next, a process for manufacturing the semiconductor device 200 will be described with reference to cross sectional views of FIGS. 17 to 22. FIG. 17 shows a stage in which the source region 8 and the channel region 7 are formed in the semiconductor device 200. The first drain contact trench 30 is formed simultaneously with the gate trench 16 (first trench) as in the case of the semiconductor device 100. The first drain contact region 25 serving as a part of the drain contact region is formed on the bottom surface of the first drain contact trench 30. A point that the source region 8 is formed on the entire surface of the channel region 7 is different from the case of the semiconductor device 100. Therefore, the photo resist 37 used in this process is different in pattern shape from the photo resist 37 used for the semiconductor device 100. After that, the photo resist 37 is removed and heat treatment is performed to activate impurities. The heat treatment may be omitted to activate the impurities by subsequent heat treatment.

Figure 18:
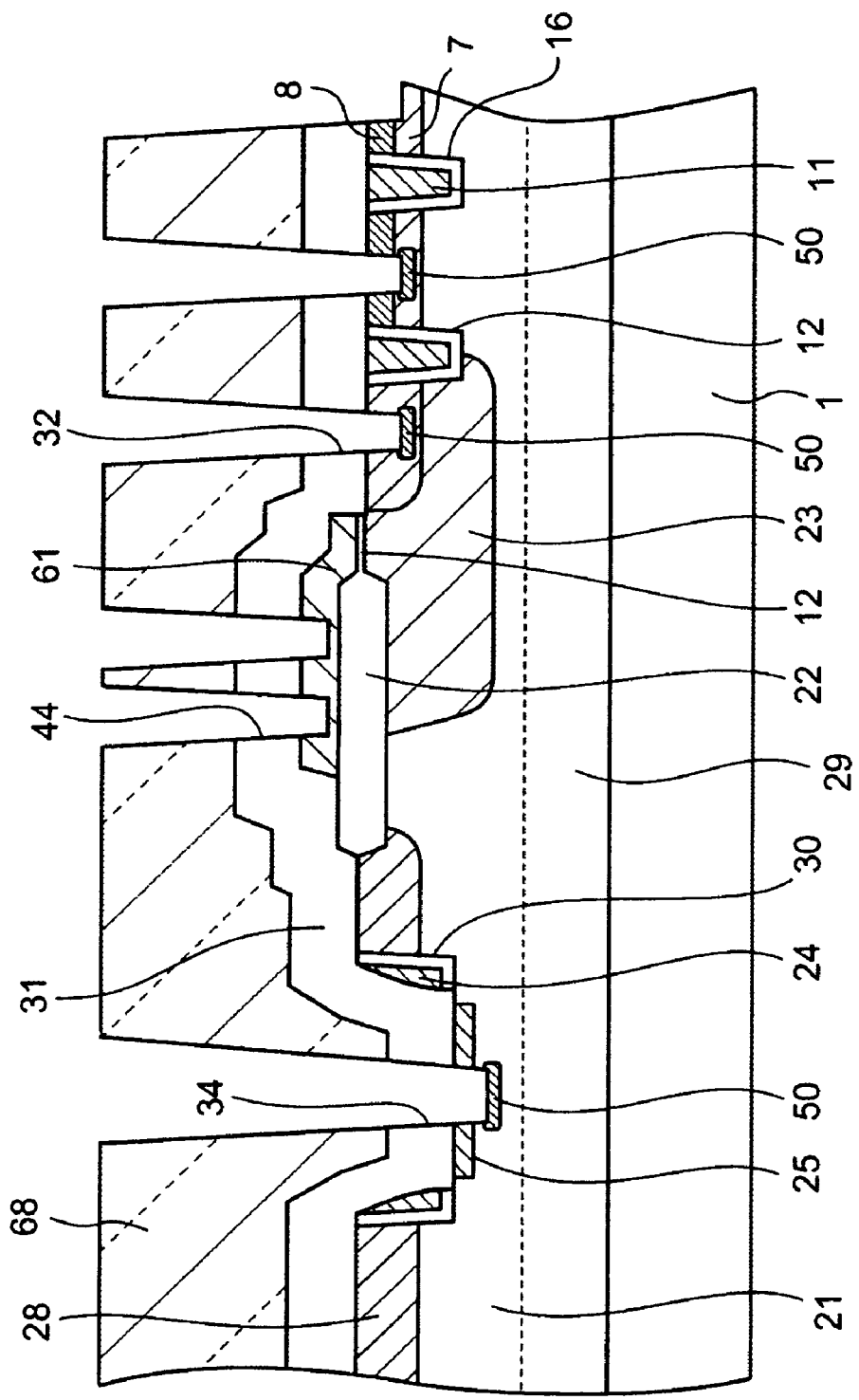
FIG. 18 is an explanatory cross sectional view taken along the line B-B, showing a process of manufacturing the semiconductor device of FIG. 15.

Next, an insulating film such as a BPSG film is formed on the entire surface to provide the interlayer insulating films 31. The interlayer insulating film 31 may be flattened by reflow. A photo resist 68 is formed and then the contact trenches 32, gate plug trenches 44, and the second drain contact trench 34 are simultaneously formed as shown in FIG. 18. The contact trench 32 has a depth so as to extend through the source region 8 and reaches the channel region 7. A side surface of the source region 8 is to be connected with the source electrode 14. The gate plug trenches 44 are formed so as to reach the middle of the gate lead wiring 61. Even when the gate lead wiring 61 is thin and the gate plug trenches 44 extends therethrough to expose the LOCOS oxide film 22, there is no problem on withstand voltage because the LOCOS oxide film 22 is thick. The second drain contact trench 34 are formed at a depth corresponding to a level lower than the bottom surface of the first drain contact trench 30. After that, P$^+$-type impurities are ion-implanted to the bottom portions of the contact trenches 32, the gate plug trenches 44, and the first drain contact trench 34 to form contact diffusion regions 50. Even when the P$^+$-type impurities are ion-implanted to the LOCOS oxide film 22, the insulation performance thereof is not damaged. Although it is likely to ion-implant the P$^+$-type impurities to the gate lead wiring 61, the gate lead wiring 61 is not almost affected thereby because impurities whose concentrations are significantly higher are introduced into the polycrystalline silicon layer 24. Then, the photo resist 68 is removed and heat treatment is performed to activate the impurities. The heat treatment for activating the impurities may be omitted to activate the impurities by subsequent heat treatment.

Figure 19:
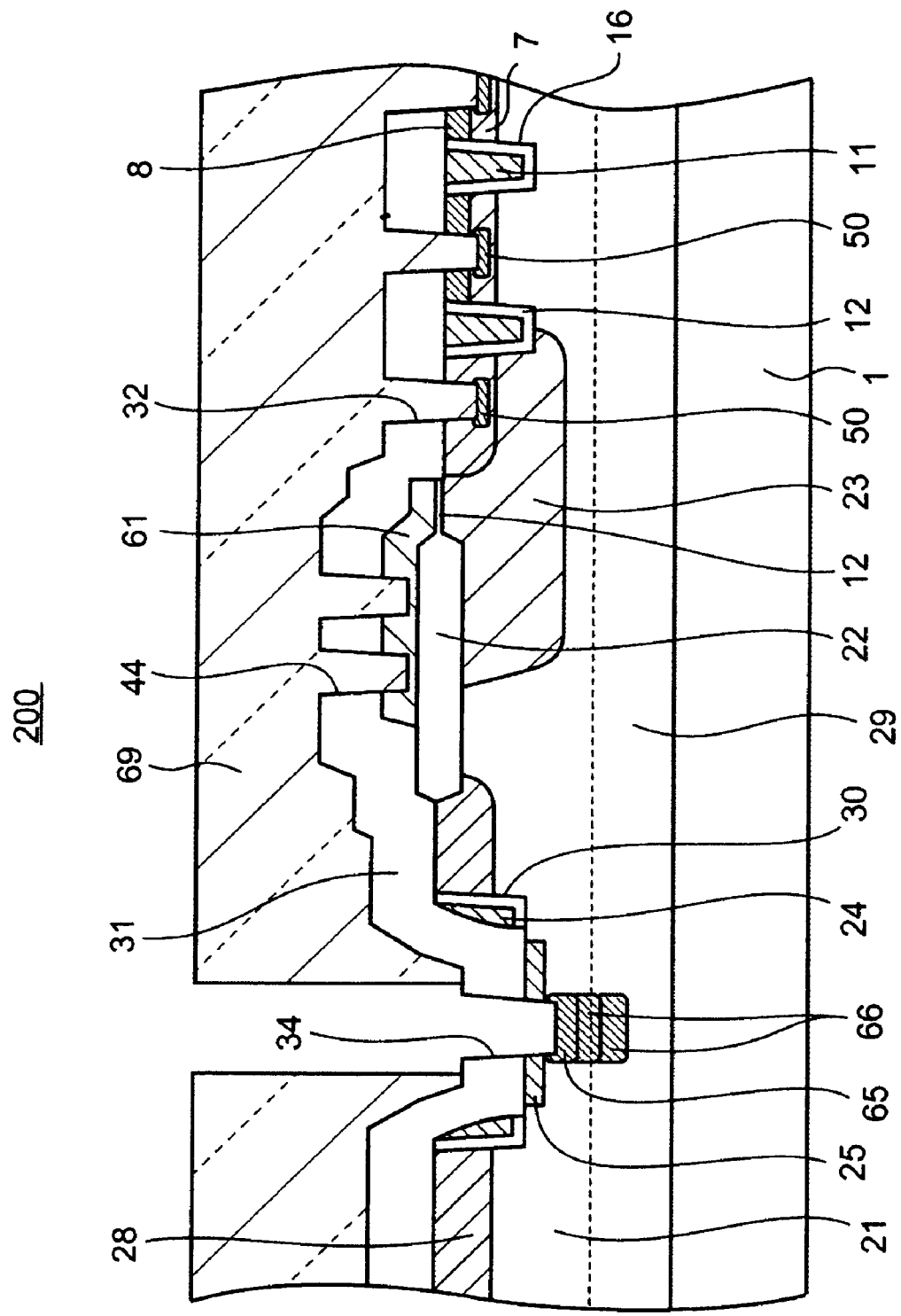
FIG. 19 is an explanatory cross sectional view taken along the line B-B, showing a process of manufacturing the semiconductor device of FIG. 15.

Next, as shown in FIG. 19, a photo resist 69 for exposing the second drain contract trench 34 is formed, and N$^+$-type impurities are ion-implanted to form the second drain contact region 65, and N-type impurities are ion-implanted to form the third drain contact regions 66. The second drain contact region 65 and the third drain contact regions 66 also serve as the drain contact region. The third drain contact regions 66 preferably reach the diffused layer 29. When ion implantation is performed such that the impurity concentration higher than that of the diffused layer 29 is maintained up to a deeper position, the resistance value can be reduced to a smaller value. Ion implantation may be performed multiple times at different accelerating energies. The same P$^+$-type impurities as those ion-implanted to the contact diffusion regions 50 is ion-implanted to the bottom portion of the second drain contact trench 34 in the preceding process. Therefore, it is desirable to increase the N-type impurity concentration in order to prevent the P-type impurity region from being left on the bottom portion of the second drain contact trench 34.

In the above-mentioned example, in order to minimize the ON-resistance, the third drain contact regions 66 are formed in contact with the diffused layer 29. Even when the drift region 21 is slightly left between the third drain contact regions 66 and the diffused layer 29, the ON-resistance is suppressed to a low value.

Figure 20:
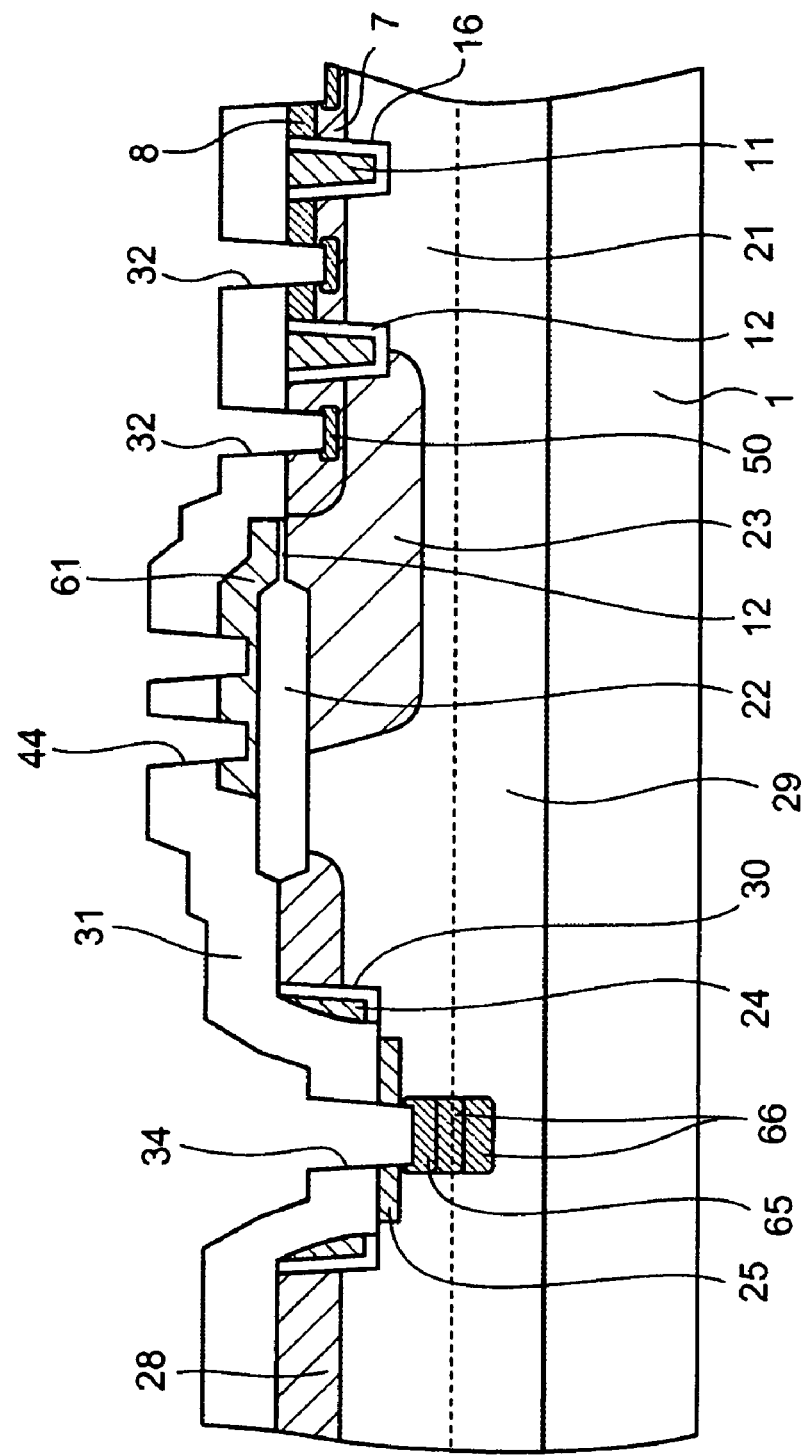
FIG. 20 is an explanatory cross sectional view taken along the line B-B, showing a process of manufacturing the semiconductor device of FIG. 15.

After that, as shown in FIG. 20, the photo resist 69 is removed and heat treatment is performed to activate the impurities. The final heat treatment for activating the impurities is completed. The thickness of the diffused layer 29 is determined by the heat treatment.

Figure 21:
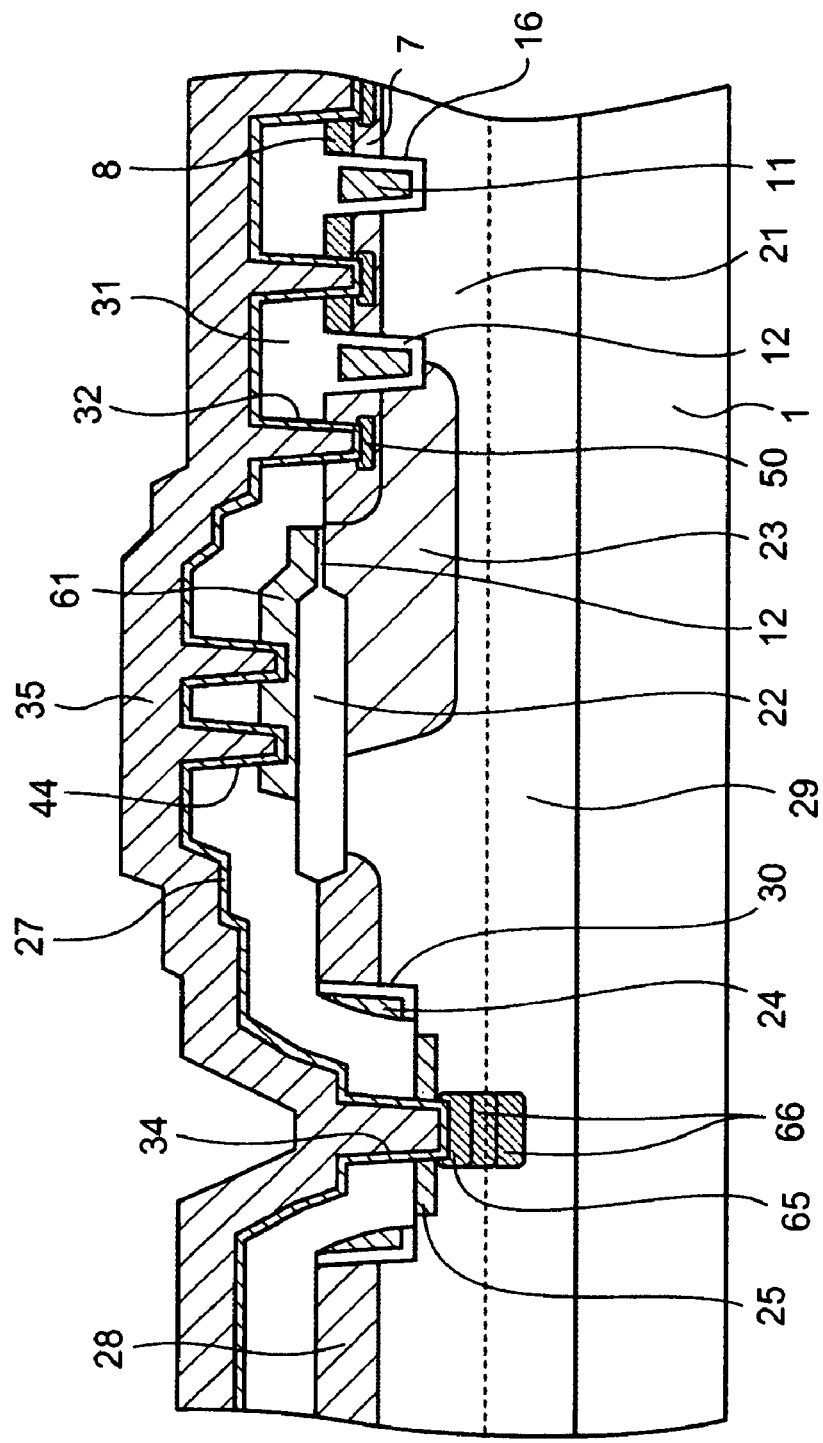
FIG. 21 is an explanatory cross sectional view taken along the line B-B, showing a process of manufacturing the semiconductor device of FIG. 15.

Next, as shown in FIG. 21, the barrier metal layer 27 such as a Ti/TiN layer and a conductive layer 35 (second conductive layer) such as a tungsten (W) layer are formed on the entire surface.

Figure 22:
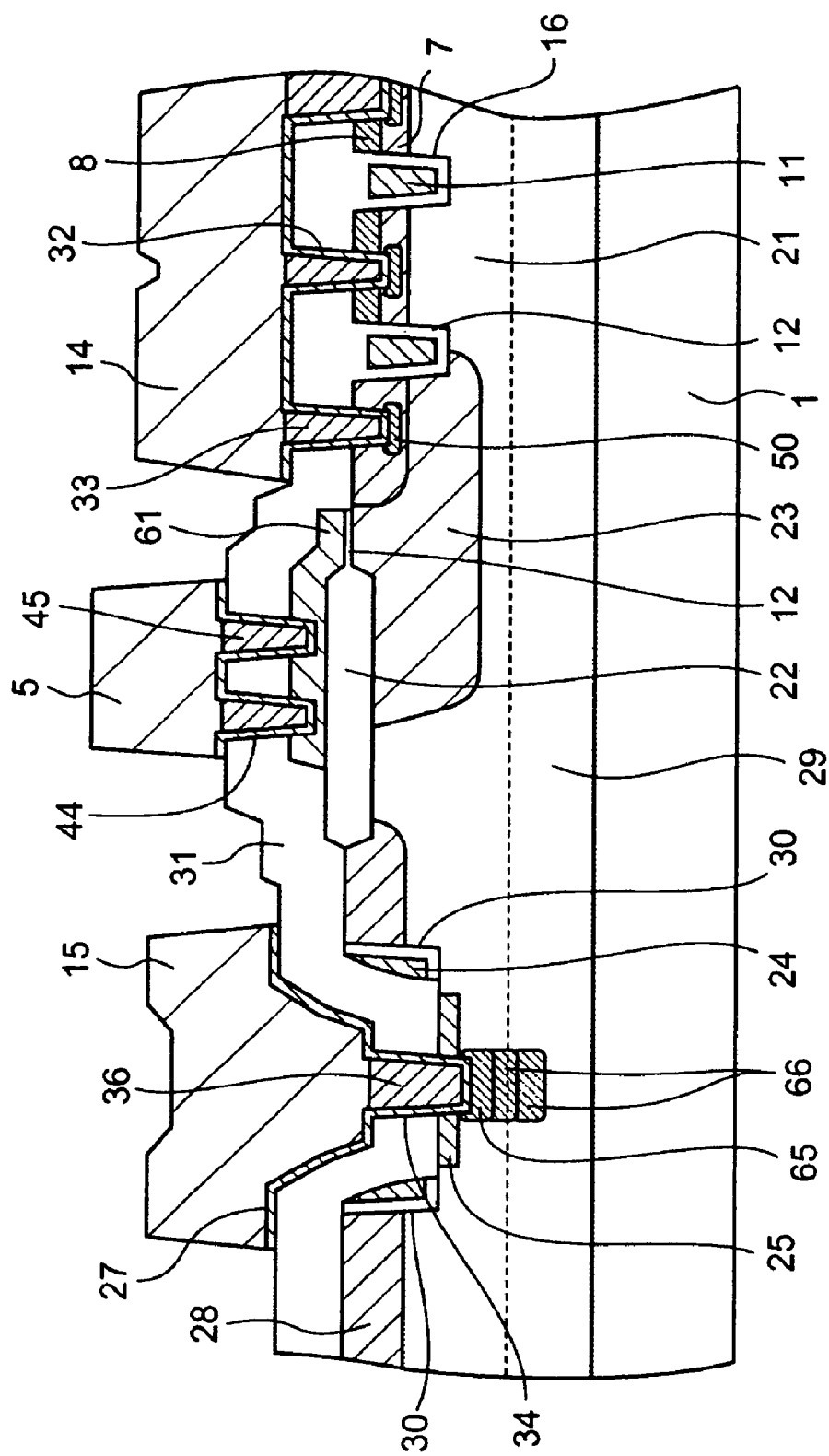
FIG. 22 is an explanatory cross sectional view taken along the line B-B, showing a process of manufacturing the semiconductor device of FIG. 15.

Next, the conductive layer 35 is etched back to be left in the inner portions of the contact trenches 32, the gate plug trenches 44, and the second drain contact trench 34, thereby forming the contact plugs 33, gate wiring plugs 45, and a drain plug 36. Then, as in the case of the semiconductor device 100, a conductive layer such as an AlSiCu layer or an AlCu layer is formed to provide the drain electrode 15, the gate wiring 5, and the source electrode 14 as shown in FIG. 22. In the case of the semiconductor device 200, the barrier metal layer 27, the drain plug 36, and the drain electrode 15 are formed in the drain contact trench (first drain contact trench 30 and second drain contact trench 34) to be connected with the first drain contact region 25 and the second drain contact region 65 which are parts of the drain contact region. The barrier metal layer 27, the drain plug 36, and the drain electrode 15 serve as the drain electrode. After that, when the cover insulating film 48, the UBM 49, the external source terminal 2, the external drain terminal 3, and the external gate terminal 4 are formed as in the case of the semiconductor device 100, the semiconductor device 200 as shown in FIGS. 15 and 16 can be produced.

According to the semiconductor device 200, the second drain contact trench 34 is formed, so the drain contact trench can be formed at a depth deeper than that of the first drain contact trench 30. Therefore, the drain contact region can be easily formed in a position deeper than that in the case of the semiconductor device 100 to further reduce the resistance value, with the result that the ON-resistance can be reduced to a value smaller than that in the case of the semiconductor device 100. As the cases of in the contact plugs 33 and the gate wiring plugs 45, the barrier metal layer 27 and the drain plug 36 are buried in the second drain contact trench 34 and the drain electrode 15 is formed on the barrier metal layer 27 and the drain plug 36, so there is no fear that where a void occurs or the film thickness of the conductive layer of the drain electrode becomes insufficient.

The first drain contact region 25 is not essential. However, when the first drain contact region 25 is provided, a current path is formed on a side surface of the drain contact trench 30 through the first drain contact region 25, so the resistance value becomes smaller. When the first drain contact region 25 and the second drain contact region 65 are formed so as to be in contact with each other, the resistance value can be further reduced. The first drain contact region 25 can be formed simultaneously with the source region 8, so the number of steps does not increase.

The first drain contact trench 30 and the second drain contact trench 34 can be formed simultaneously with the gate trench 16 and the contact trench 32, respectively, and the drain plug 36 can be formed simultaneously with the contact plug 33. Therefore, the number of trench forming steps and the number of plug forming steps do not increase.

When a distance between a bottom surface of the channel region 7 and an upper surface of the diffused layer 29 is to be reduced to reduce the ON-resistance of a transistor cell, a distance between a bottom surface of the contact trench 32 and the diffused layer 29 shortens and a distance between a bottom surface of the second drain contact trench 34 and the diffused layer 29 also shortens. When the second drain contact trench 34 is deeply formed so as to reach the diffused layer 29, the resistance value between the drain region and the drain electrode can be further reduced. This is an advantage. However, when the distance between the bottom surface of the channel region 7 and the upper surface of the diffused layer 29 is reduced, the withstand voltage reduces. Therefore, it is necessary to further form a punch through prevention structure to restore the withstand voltage.

Embodiment 3

Figure 23:
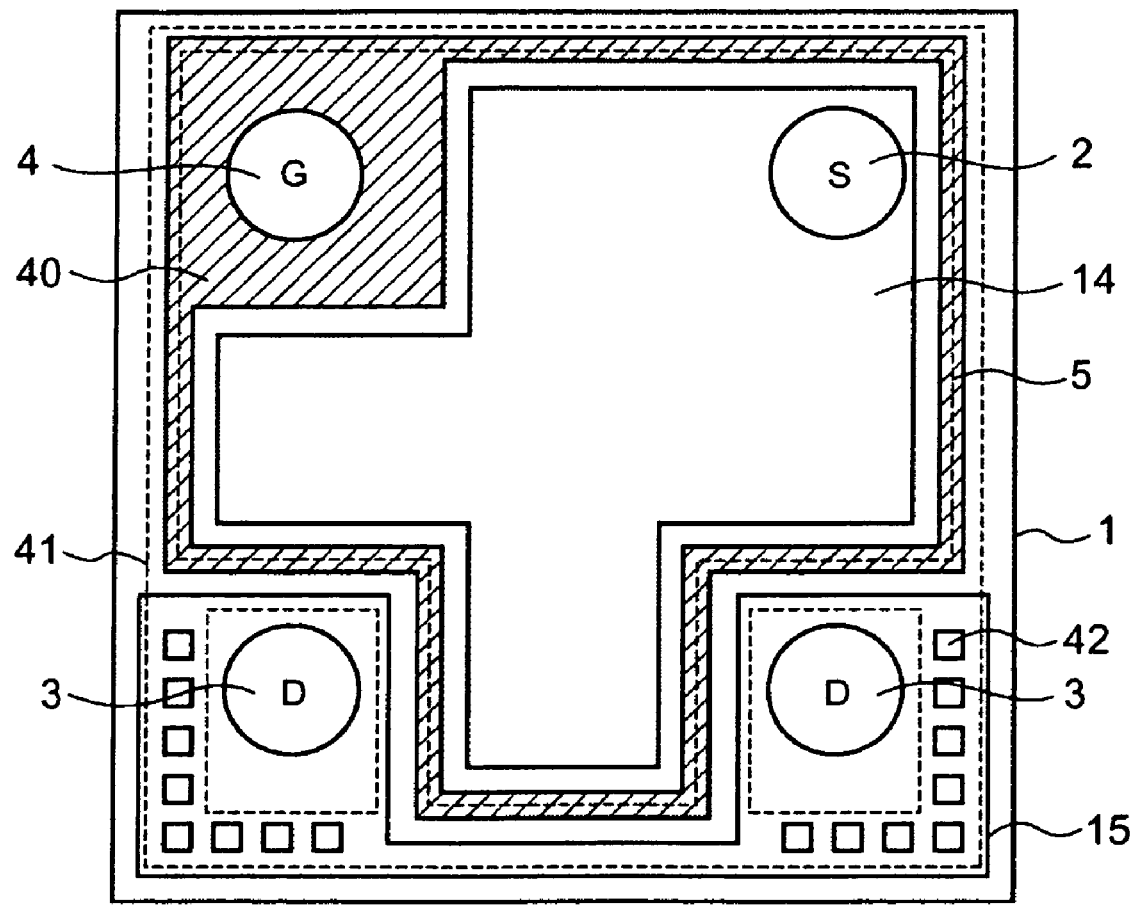
FIG. 23 is an explanatory plan view showing a semiconductor device according to Embodiment 3 of the present invention.

FIG. 23 is an explanatory plan view showing a semiconductor device 300 according to Embodiment 3 of the present invention. The semiconductor device 300 further includes an equipotential ring 41 which is an annular conductive layer and provided in an outer periphery of a semiconductor chip. In the case of the equipotential ring 41, an annular conductive layer is provided in the outer periphery of the semiconductor chip (die) to stably hold a potential of the semiconductor body in an end portion of the semiconductor chip, thereby preventing a reduction in withstand voltage in the end portion of the semiconductor chip. The semiconductor device 300 is significantly different from the semiconductor devices 100 and 200 in the point that the equipotential ring 41 which is formed simultaneously with the gate lead wiring 61 and made of polycrystalline silicon and equipotential ring contacts 42 for connecting the equipotential ring 41 with the drain electrode 15 are further provided. In order to make clear the different point between the semiconductor device 300 and the semiconductor devices 100 and 200, the same structure as that of each of the semiconductor devices 100 and 200 is employed, except for the point that the equipotential ring 41 and the equipotential ring contacts 42 are provided.

Figure 24:
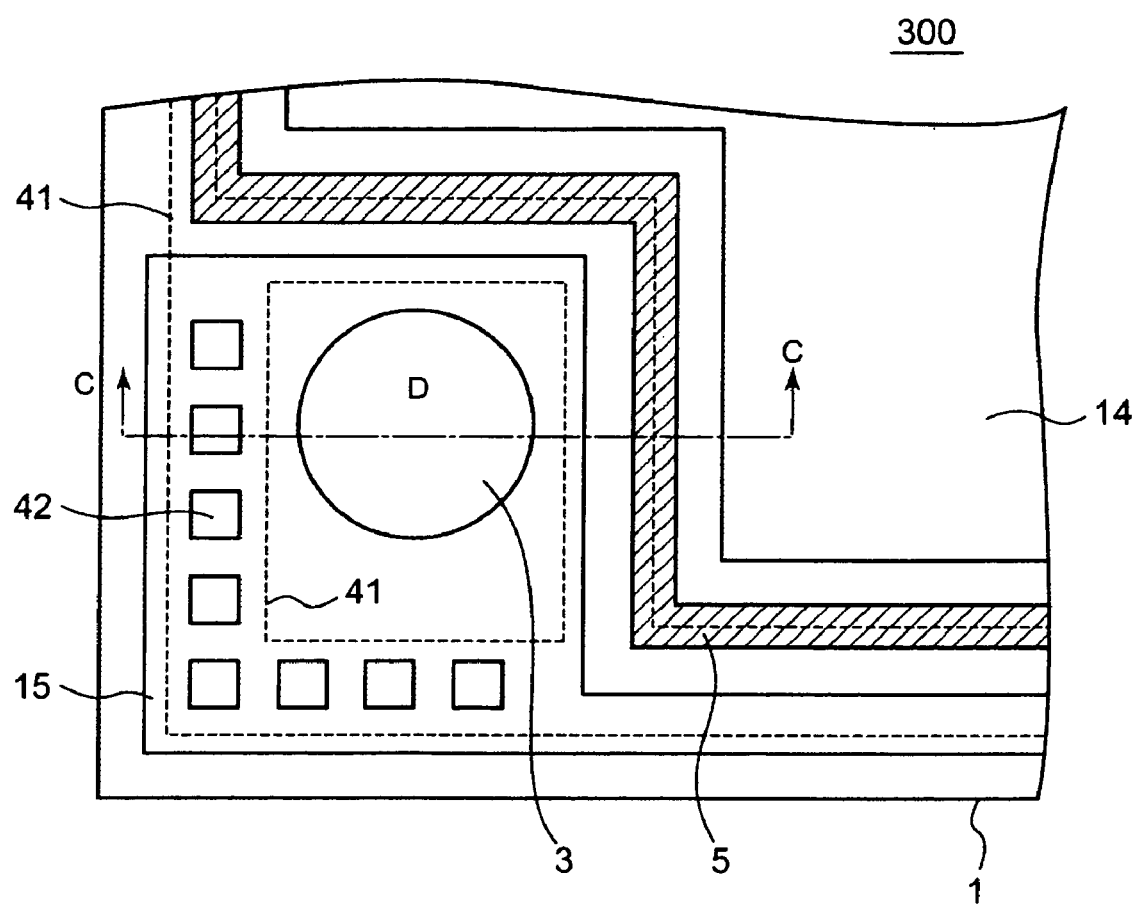
FIG. 24 is a partially enlarged explanatory plan view showing the semiconductor device according to Embodiment 3 of the present invention.

FIG. 24 is an enlarged view showing the drain electrode 15 and the vicinity thereof on the lower left region of the semiconductor device 300. The equipotential ring 41 is formed so as to overlap with an outside region of the gate wiring 5 and formed along an outside edge of the LOCOS oxide film 22 (see FIG. 25) and formed over an upper surface of the P-type diffusion region 28 in the outer periphery. The P-type diffusion region 28 is formed outside the LOCOS oxide film 22, so the equipotential ring 41 is annularly formed in the end portion of the semiconductor device 300. The equipotential ring 41 extends to partially overlap with the drain electrode 15 and is connected with the drain electrode 15 through the equipotential ring contacts 42.

Figure 25:
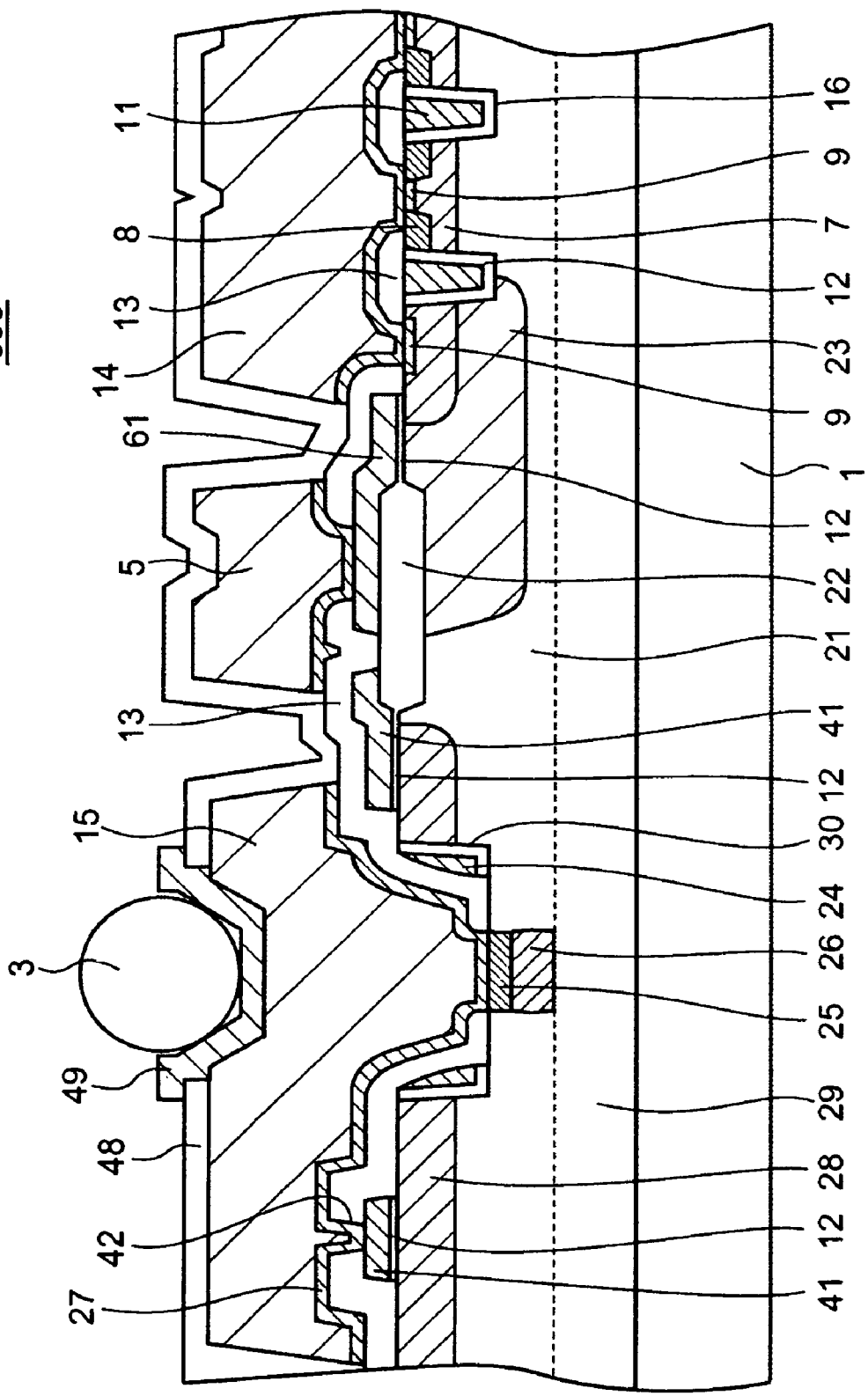
FIG. 25 is a cross sectional view taken along the line C-C of FIG. 24.

FIG. 25 is a cross sectional view taken along the C-C line of FIG. 24, showing an example in which the equipotential ring 41 is formed in a semiconductor device which is of the type of the semiconductor device 100. In other words, the semiconductor device 300 includes the equipotential ring 41 formed simultaneously with the gate lead wiring 61. The equipotential ring 41 includes the polycrystalline silicon layer 24 which is made of a conductive layer. As in the case of the gate lead wiring 61, the gate oxide film 12 is formed under the equipotential ring 41. The equipotential ring 41 is connected with the drain electrode 15 through the equipotential ring contact 42 formed on the interlayer insulating film 13. A contact hole for the equipotential ring contact 42 can be formed simultaneously with the formation of the contact holes in the interlayer insulating film 13. Therefore, the number of steps of forming the equipotential ring 41 and the equipotential ring contact 42 does not increase.

According to the semiconductor device 300, a capacitor includes the equipotential ring 41, the P-type diffusion region 28, and the gate oxide film 12 sandwiched therebetween and is annularly formed in the outer periphery of the semiconductor device 300. When the equipotential ring 41 is stably maintained at the drain potential, a potential of the P-type diffusion region 28 is stably held. Therefore, a potential of the end portion of the semiconductor device 300 is stably held, so the withstand voltage can be improved. According to the semiconductor device 300, the equipotential ring can be formed in the semiconductor device which is of the type of the semiconductor device 100 without increasing the number of steps, thereby improving the withstand voltage.

Figure 26:
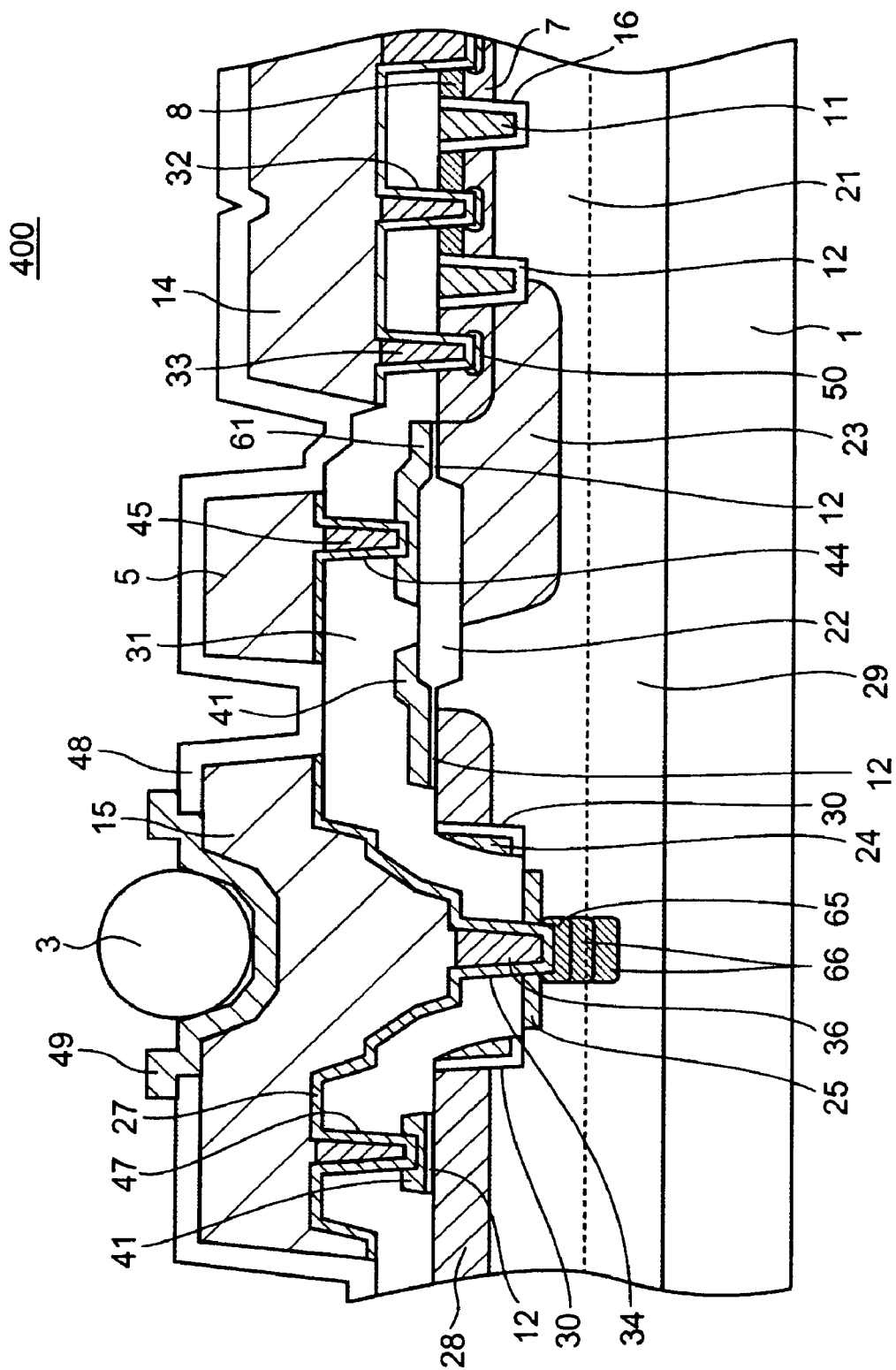
FIG. 26 is an explanatory cross sectional view taken along the line C-C, showing a modified example of the semiconductor device according to Embodiment 3 of the present invention.

FIG. 26 is a cross sectional view taken along the C-C line of FIG. 24, showing an example in which the equipotential ring 41 is formed in a semiconductor device which is of the type of the semiconductor device 200. A semiconductor device 400 includes the equipotential ring 41 and an equipotential ring contact 47. The equipotential ring 41 is formed as in the case of the semiconductor device 300. The equipotential ring contact 47 is formed simultaneously with the formation of the contact trench 32, the gate plug trench 44 and the second drain contact trench 34 and the formation of the contact plug 33, the gate wiring plug 45 and the drain plug 36. The equipotential ring 41 and the equipotential ring contact 47 have the same functions as those in the case of the semiconductor device 300. According to the semiconductor device 400, the equipotential ring can be formed in the semiconductor device which is of the type of the semiconductor device 200 without increasing the number of steps, thereby improving the withstand voltage.

Embodiment 4

Figure 27:
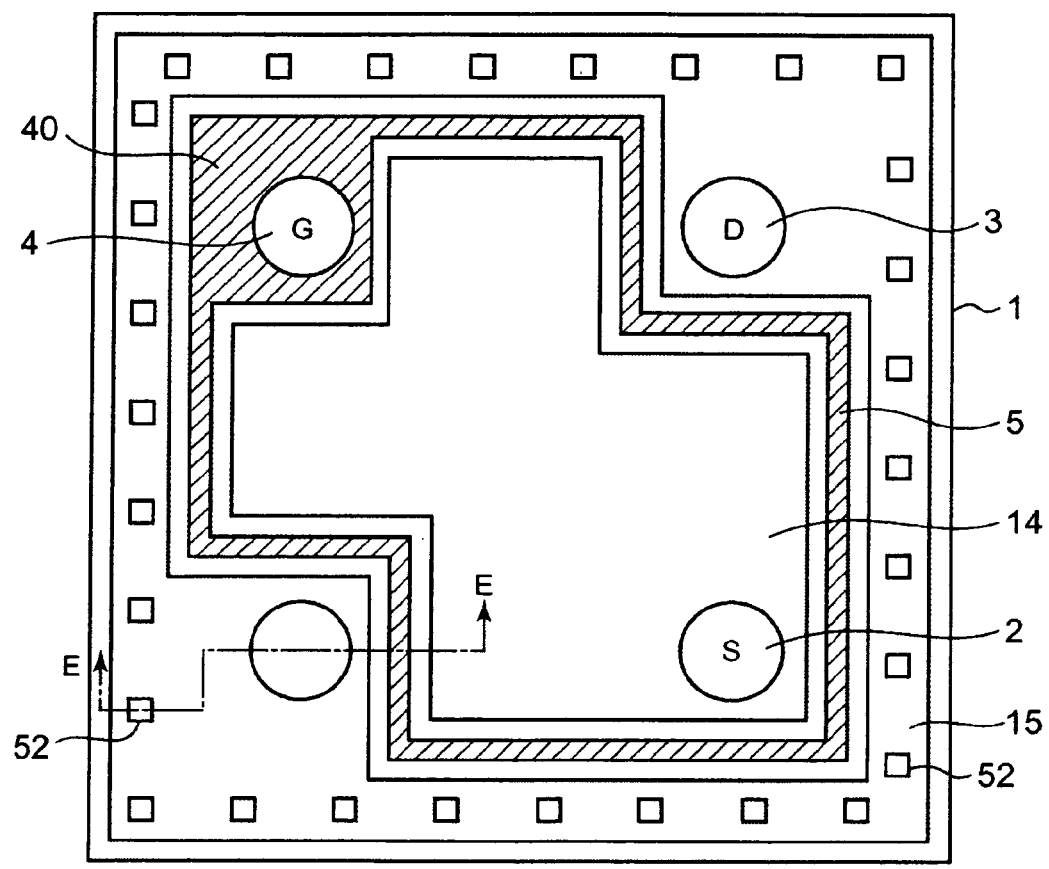
FIG. 27 is an explanatory plan view showing a semiconductor device according to Embodiment 4 of the present invention.

Embodiment 4 shows not the example in which the equipotential ring includes the polycrystalline silicon layer as in Embodiment 3 but an example in which the drain electrode 15 extends to surround the outer periphery and thus also serves as the equipotential ring. FIG. 27 is an explanatory plan view showing a semiconductor device 500 according to Embodiment 4 of the present invention. As shown in FIG. 27, the drain electrode 15 is formed so as to surround the outer periphery of the semiconductor device 500. Equipotential ring contacts 52 are formed in the drain electrode 15 at substantially regular intervals.

Figure 28:
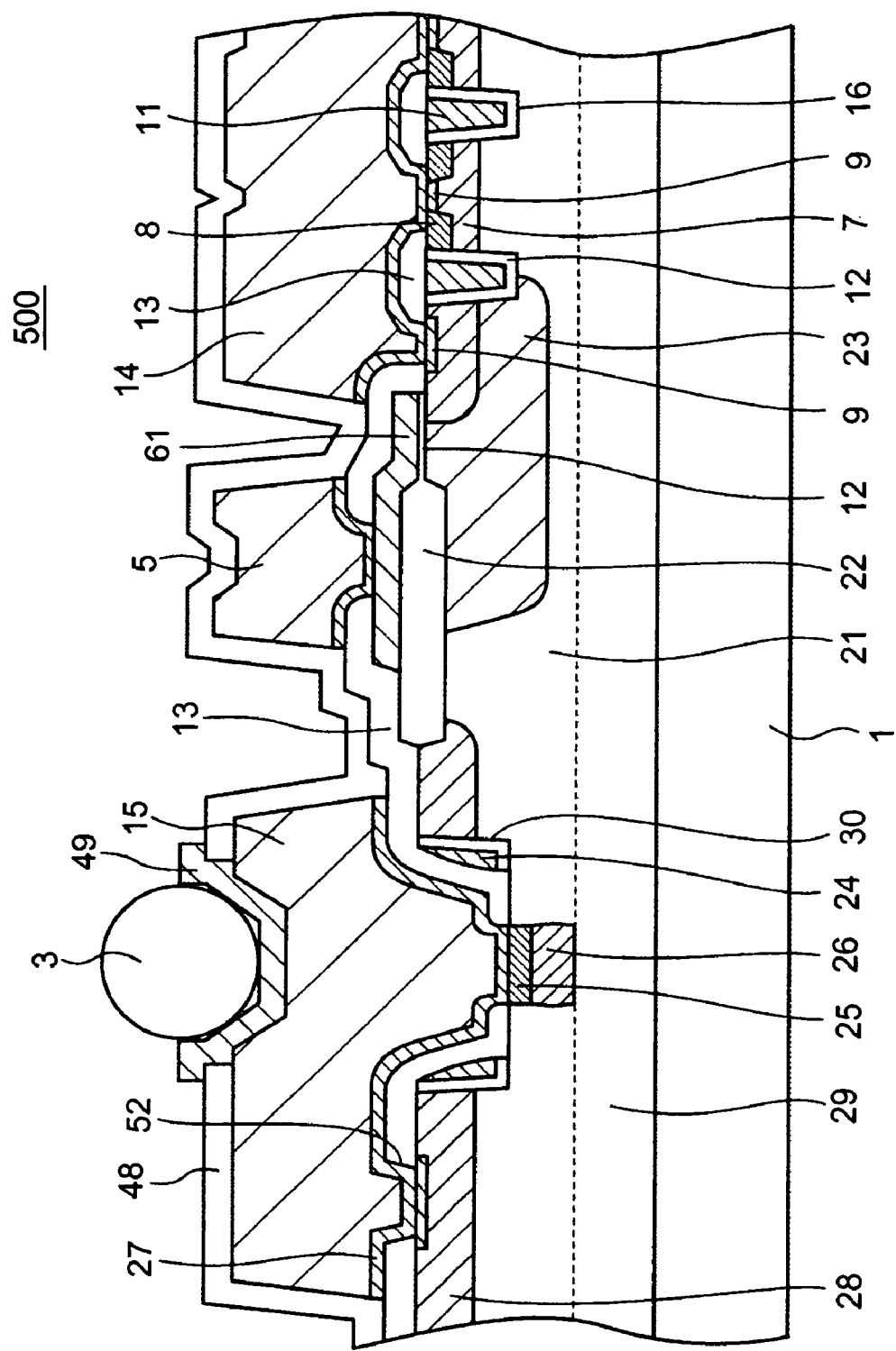
FIG. 28 is a cross sectional view taken along the line E-E of FIG. 27.

FIG. 28 is a cross sectional view taken along the E-E line of FIG. 27, showing an example in which the drain electrode 15 also serves as the equipotential ring in a semiconductor device which is of the type of the semiconductor device 100. Unlike the semiconductor device 300 (FIG. 25), the semiconductor device 500 does not include the equipotential ring 41 having the polycrystalline silicon layer and the drain electrode 15 is electrically connected with the P-type diffusion region 28 through the equipotential ring contact 52 formed in the interlayer insulating film 13 to serve as the equipotential ring. The P-type diffusion region 28 is annularly formed in the end portion of the semiconductor device 500 and connected with the drain electrode 15 at a suitable interval, so the end portion of the semiconductor device 500 is fixed at the drain potential. The P-type diffusion region 28 is different in conductivity type from the drift region 21 located thereunder. However, the drift region 21 is also electrically connected with the drain electrode 15 through the first drain contact region 25 and the second drain contact region 26, so the potential of the P-type diffusion region 28 and the potential of the drift region 21 are equal to the drain potential. The drain electrode 15 may be brought into contact with the drift region 21 without forming the P-type diffusion region 28, but the number of mask pattern forming steps increases. A contact hole for the equipotential ring contact 52 can be formed simultaneously with the formation of the contact holes for the interlayer insulating film 13, so the number of steps does not increase. According to the semiconductor device 500, the drain electrode 15 can be also served as the equipotential ring in the semiconductor device which is of the type of the semiconductor device 100 without increasing the number of steps, thereby improving the withstand voltage.

Figure 29:
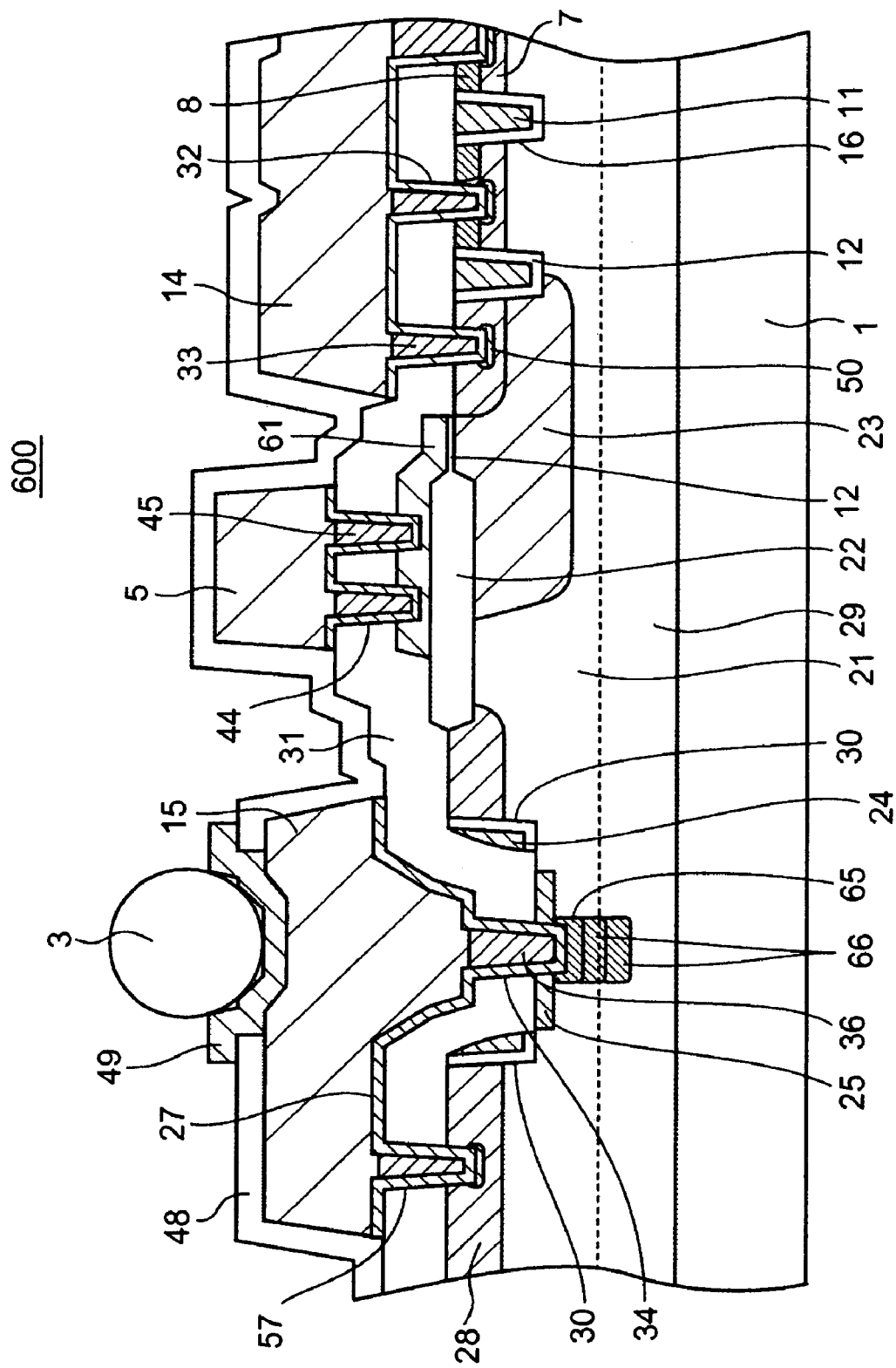
FIG. 29 is an explanatory cross sectional view taken along the line E-E, showing a modified example of the semiconductor device according to Embodiment 4 of the present invention.
Figure 30:
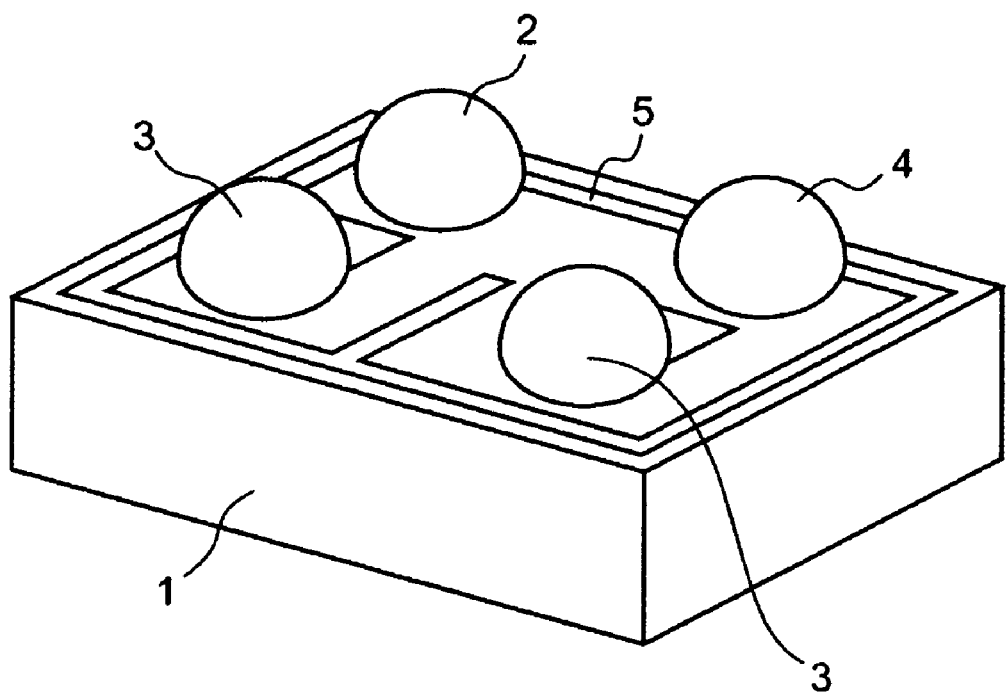
FIG. 30 is a perspective view showing a conventional semiconductor device 10.
Figure 31:
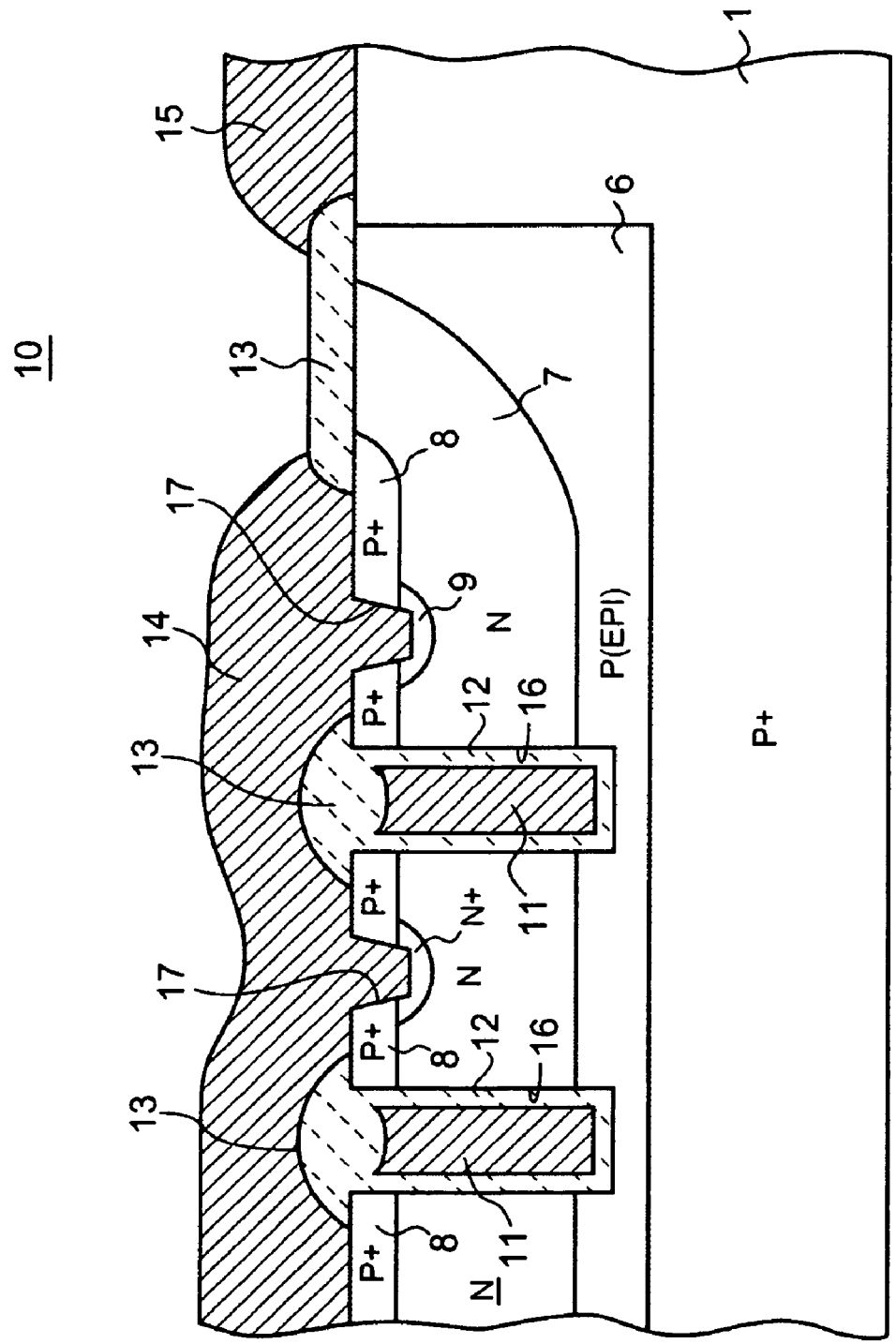
FIG. 31 is a cross sectional view showing the conventional semiconductor device 10.

FIG. 29 is a cross sectional view taken along the E-E line of FIG. 27, showing an example in which the drain electrode 15 also serves as the equipotential ring in a semiconductor device which is of the type of the semiconductor device 200. Unlike the semiconductor device 400 (FIG. 26), a semiconductor device 600 does not include the equipotential ring 41 having the polycrystalline silicon layer and the drain electrode 15 is electrically connected with the P-type diffusion region 28 through an equipotential ring contact 57 and a $P^+$-type diffusion region formed immediately under the equipotential ring contact 57, and thus serves as the equipotential ring. The equipotential ring contact 57 is formed simultaneously with the formation of the contact trench 32, the gate plug trench 44, and the second drain contact trench 34 and the formation of the contact plugs 33, the gate wiring plugs 45, and the drain plug 36, so the number of steps does not increase. According to the semiconductor device 600, the drain electrode 15 can also serve as the equipotential ring in the semiconductor device which is of the type of the semiconductor device 200 without increasing the number of steps, thereby improving the withstand voltage.

In the above-mentioned embodiments, the N-channel type vertical MOSFET is described. A P-channel type vertical MOSFET may be employed.

Although the invention has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A method of manufacturing a semiconductor device, comprising:
   forming a first trench and a second trench in a semiconductor region of a first conductivity type simultaneously;
   forming a gate insulating film and a gate electrode in the first trench;
   forming an annular conductive layer simultaneously with the gate electrode, the annular conductive layer being located at a peripheral portion of the semiconductor region in a plan view;
   forming a channel region of a second conductivity type in the semiconductor region;
   forming a source region of the first conductivity type in the channel region;
   forming a diffusion region of the first conductivity type which has a higher concentration than that of a semiconductor region in a part of the semiconductor region of the first conductivity type located immediately under the second trench by implanting impurity ions of the first conductivity type through the second trench; and
   forming a drain electrode in a part of the second trench,
   wherein the drain electrode is electrically connected with the annular conductive layer.

2. The method of manufacturing a semiconductor device according to claim 1, further comprising:
   forming a third trench to expose in a part of the semiconductor region located immediately under the second trench,
   wherein a part of the drain electrode is formed in the third trench.

3. The method of manufacturing a semiconductor device according to claim 2, wherein:
   the forming a diffusion region of the first conductivity type which has a higher concentration than that of the semiconductor region in a part of the semiconductor region located immediately under the second trench is provided by implanting impurity ions of the first conductivity type through the third trench.

4. The method of manufacturing a semiconductor device according to claim 1, further comprising:
   forming a fourth trench to expose the source region and the channel region,
   wherein the third trench and the fourth trench are simultaneously formed.

5. The method of manufacturing a semiconductor device according to claim 4, further comprising:
   forming an interlayer insulating film above the channel region and the source region and in the second trench,
   wherein the third and fourth trenches are formed so as to penetrate through the interlayer insulating film.

6. The method of manufacturing a semiconductor device according to claim 1, the forming a drain electrode further comprising:
   forming a source electrode and a gate wiring simultaneously with the drain electrode,
   wherein the source electrode is electrically connected with the channel region and the source region, and the gate wiring is electrically connected with the gate electrode.

7. The method of manufacturing a semiconductor device according to claim 6, further comprising:

providing an external source terminal, an external gate terminal and an external drain terminal on a same surface of the semiconductor device, wherein the external source terminal, the external gate terminal and the external drain terminal are formed on the source electrode, the gate wiring and the drain electrode, respectively.

8. The method of manufacturing a semiconductor device according to claim 1, wherein the drain electrode is annularly formed.

9. A method of manufacturing a semiconductor device, comprising:

forming a first trench and a second trench in a semiconductor region of a first conductivity type simultaneously;

forming a gate insulating film and a gate electrode in the first trench;

forming a channel region of a second conductivity type and an annular diffusion region of the second conductivity type simultaneously in the semiconductor region, the annular diffusion region being located at a peripheral portion of the semiconductor region in a plan view;

forming a source region of the first conductivity type in the channel region;

forming a diffusion region of the first conductivity type which has a higher concentration than that of the semiconductor region in a part of the semiconductor region located immediately under the second trench by implanting impurity ions of the first conductivity type through the second trench; and forming a drain electrode in a part of the second trench, wherein the drain electrode is electrically connected with the annular diffusion region.

10. The method of manufacturing a semiconductor device according to claim 9, wherein a conductive layer is located right above the annular diffusion region.

11. The method of manufacturing a semiconductor device according to claim 9, wherein the drain electrode is annularly formed.

12. The method of manufacturing a semiconductor device according to claim 9, further comprising:

providing an external source terminal, an external gate terminal and an external drain terminal on a same surface of the semiconductor device, wherein the external source terminal, the external gate terminal and the external drain terminal are electrically connected with the source region, the gate electrode and the drain electrode, respectively.

13. The method of manufacturing a semiconductor device according to claim 9, further comprising:

forming a third trench to expose in a part of the semiconductor region located immediately under the second trench, wherein a part of the drain electrode is formed in the third trench.

14. The method of manufacturing a semiconductor device according to claim 13, wherein:

the forming a diffusion region of the first conductivity type which has a higher concentration than that of the semiconductor region in a part of the semiconductor region located immediately under the second trench is provided by implanting impurity ions of the first conductivity type through the third trench.

15. The method of manufacturing a semiconductor device according to claim 9, further comprising:

forming a fourth trench to expose the source region and the channel region, wherein the third trench and the fourth trench are simultaneously formed.

16. The method of manufacturing a semiconductor device according to claim 15, further comprising:

forming an interlayer insulating film above the channel region and the source region and in the second trench, wherein the third and fourth trenches are formed so as to penetrate through the interlayer insulating film.

* * * * *